(12) United States Patent
Sakashita et al.

(10) Patent No.: US 10,283,373 B2
(45) Date of Patent: May 7, 2019

(54) CMP POLISHING LIQUID AND POLISHING METHOD

(71) Applicant: HITACHI CHEMICAL COMPANY, LTD., Tokyo (JP)

(72) Inventors: Masahiro Sakashita, Hitachi (JP); Naomi Watanabe, Hitachi (JP); Masayuki Hanano, Hitachi (JP); Kouji Mishima, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/324,578

(22) PCT Filed: Jul. 8, 2015

(86) PCT No.: PCT/JP2015/069662
§ 371 (c)(1),
(2) Date: Jan. 6, 2017

(87) PCT Pub. No.: WO2016/006631
PCT Pub. Date: Jan. 14, 2016

(65) Prior Publication Data
US 2017/0154787 A1    Jun. 1, 2017

(30) Foreign Application Priority Data

Jul. 9, 2014  (JP) ................................. 2014-141533

(51) Int. Cl.
*H01L 21/321*   (2006.01)
*C09G 1/02*   (2006.01)
(Continued)

(52) U.S. Cl.
CPC .......... *H01L 21/3212* (2013.01); *B24B 37/00* (2013.01); *B24B 37/044* (2013.01);
(Continued)

(58) Field of Classification Search
CPC .......... H01L 21/3212; H01L 21/76865; H01L 21/7684; H01L 23/53238; H01L 21/31058; H01L 21/31053; C09G 1/02; B24B 37/044
See application file for complete search history.

(56) References Cited

U.S. PATENT DOCUMENTS

2005/0076580 A1* 4/2005 Tamboli ................. C09G 1/02
51/307
2007/0090094 A1* 4/2007 Thompson .............. C09G 1/02
216/89
(Continued)

FOREIGN PATENT DOCUMENTS

JP    2000-144109    *  5/2000  ............... C09K 3/14
JP    2000144109 A   *  5/2000
(Continued)

OTHER PUBLICATIONS

JP-2000144109 Translated Abstract (2000) (Year: 2000).*
(Continued)

*Primary Examiner* — Duy Vu N Deo
*Assistant Examiner* — Mahmoud Dahimene
(74) *Attorney, Agent, or Firm* — Fitch, Even, Tabin & Flannery, L.L.P.

(57) ABSTRACT

An embodiment of the present invention relates to a CMP polishing liquid used for polishing a polishing target surface having at least a cobalt-containing portion and a metal-containing portion that contains a metal other than cobalt, wherein the CMP polishing liquid contains polishing particles, a metal corrosion inhibitor and water, and has a pH of 4.0 or less, and when the corrosion potential $E_A$ of cobalt and the corrosion potential $E_B$ of the metal are measured in the CMP polishing liquid, the absolute value of the corrosion (Continued)

potential difference $E_A - E_B$ between the corrosion potential $E_A$ and the corrosion potential $E_B$ is 0–300 mV.

21 Claims, 4 Drawing Sheets

(51) Int. Cl.
- *H01L 23/532* (2006.01)
- *B24B 37/04* (2012.01)
- *B24B 37/00* (2012.01)
- *H01L 21/768* (2006.01)
- *C09K 13/06* (2006.01)
- *H01L 21/3105* (2006.01)

(52) U.S. Cl.
CPC ............... *C09G 1/02* (2013.01); *C09K 13/06* (2013.01); *H01L 21/76865* (2013.01); *H01L 21/31053* (2013.01); *H01L 21/31058* (2013.01); *H01L 21/7684* (2013.01); *H01L 23/53238* (2013.01)

(56) References Cited

U.S. PATENT DOCUMENTS

| | | | | |
|---|---|---|---|---|
| 2007/0108063 A1* | 5/2007 | Nakada | ............... | C09G 1/02 438/692 |
| 2007/0117394 A1* | 5/2007 | Shinoda | ............... | C09G 1/02 438/692 |
| 2008/0060278 A1 | 3/2008 | White et al. | | |
| 2008/0242090 A1* | 10/2008 | Yamada | ............... | C09G 1/02 438/692 |
| 2013/0140273 A1* | 6/2013 | Lu | ............... | C09G 1/02 216/53 |

FOREIGN PATENT DOCUMENTS

| | | | |
|---|---|---|---|
| JP | 2006-80388 A | | 3/2006 |
| JP | 2009117517 A | * | 5/2009 |
| JP | 2010-503233 A | | 1/2010 |
| JP | 2011023448 A | * | 2/2011 |
| JP | 2011-91248 A | | 5/2011 |
| JP | 2012-182158 A | | 9/2012 |
| JP | 2013-42123 A | | 2/2013 |
| JP | 2014-53484 A | | 3/2014 |
| MO | 2014/007063 A1 | | 1/2014 |
| MO | 2015/108113 A1 | | 7/2015 |
| TW | 201311841 A | | 3/2013 |
| TW | 201412907 A | | 4/2014 |

OTHER PUBLICATIONS

Machine translation of JP-2011023448-A (Year: 2011).*
JP 2009-117517 A Machine Translation (Year: 2009).*
International Search Report for PCT/JP2015/069662 dated Sep. 8, 2015; English translation submitted herewith (5 pages).
English language machine translation of JP 2000-144109 to Tomio.
English language machine translation of JP 2000-144109 to Kubo.

* cited by examiner (a)

(b)

CMP POLISHING LIQUID AND POLISHING METHOD

CROSS-REFERENCE TO RELATED APPLICATIONS

This application is a U.S. national phase application filed under 35 U.S.C. § 371 of International Application No. PCT/JP2015/069662, filed Jul. 8, 2015, designating the United States, which claims priority from Japanese Patent Application No. 2014-141533 filed Jul. 9, 2014, which are hereby incorporated herein by reference in their entirety.

TECHNICAL FIELD

Embodiments of the present invention relate to a CMP polishing liquid and a polishing method.

BACKGROUND ART

In recent years, in response to increases in the level of integration and the performance of semiconductor large-scale integrated circuits (hereafter abbreviated as "LSI"), new fine processing techniques have been developed. One of these techniques is Chemical Mechanical Polishing (hereafter abbreviated as "CMP"). CMP is a technique that is used frequently in LSI production processes, and particularly in the planarization of insulating material portions in multilayer wiring formation steps, the formation of metal plugs, and the formation of embedded wiring and the like.

In recent years, the so-called damascene method has been used for forming embedded wiring. In the damascene method, a conductive substance portion is deposited on an insulating material portion having a surface in which recesses (such as grooves) and protrusions (such as bumps) have been formed in advance, thereby embedding the conductive substance within the recesses. Subsequently, the conductive substance deposited on the protrusions (namely, the conductive substance outside of the substance within the recesses) is removed by the CMP method to form embedded wiring.

In one example of CMP of a conductive substance portion, a polishing pad is first affixed to a circular polishing surface plate (platen), and the surface of the polishing pad is dipped in a CMP polishing liquid. The surface of the substrate on which the conductive substance portion has been formed is then pressed against the polishing pad, and a prescribed pressure (hereafter referred to as the "polishing pressure") is applied from the back side of the substrate. Subsequently, with this state maintained, the polishing surface plate is rotated, thereby removing the conductive substance from the protrusions by the mechanical friction generated between the CMP polishing liquid and the conductive substance portion.

On the other hand, as illustrated in FIG. 4(a), usually, a barrier metal portion 2 is formed between the uneven insulating material portion 1 and the conductive substance portion 3 provided above that insulating material portion 1. The purposes of providing the barrier metal portion 2 include preventing diffusion of the conductive substance into the insulating material portion 1, and improving the adhesion between the insulating material portion 1 and the conductive substance portion 3. The barrier metal portion 2 is formed from a barrier-forming metal (hereafter also referred to as the "barrier metal"). Because the barrier metal is a conductor, the barrier metal needs to be removed in a similar manner to the conductive substance from those areas outside of the embedded recesses (namely, the wiring portions).

These removal processes are generally performed using a two-stage polishing method divided into a "first polishing step" of polishing the conductive substance portion 3 from the state illustrated in FIG. 4(a) until the state illustrated in FIG. 4(b), and a "second polishing step" of polishing the barrier metal portion 2 from the state illustrated in FIG. 4(b) until the state illustrated in FIG. 4(c), with a different CMP polishing liquid used for each of the polishing steps.

As design rules have become ever finer, the thickness of each of the above portions has also tended to decrease. However, as the barrier metal portion 2 becomes thinner, the effect of the barrier metal portion in preventing diffusion of the conductive substance tends to deteriorate. Further, the adhesion to the conductive substance portion 3 also tends to deteriorate. Moreover, as the width of the recesses (the width of the wiring) is narrowed, a new problem arises in that embedding the conductive substance within the recesses becomes more difficult (namely, the embeddability deteriorates), increasing the likelihood of holes known as voids occurring in the conductive substance portion 3.

For this reason, the use of cobalt (Co) as the barrier metal is being investigated. By using cobalt, diffusion of the conductive substance can be suppressed. Further, because cobalt also exhibits excellent affinity with the conductive substance (for example, copper-based metals such as copper and copper alloys), the embeddability of the conductive substance can be improved. Moreover, cobalt can also enhance the adhesion between the insulating material and the conductive substance.

When cobalt is used for the barrier metal portion 2, a CMP polishing liquid capable of removing cobalt must be used. A variety of compositions are known as CMP polishing liquids for metals, but such CMP polishing liquids are not necessarily capable of removing any metal. Among conventional CMP polishing liquids for metals, liquids for removing metals such as copper, tantalum, titanium, tungsten, and aluminum and the like are well known. However, although several liquids such as those disclosed in Patent Literatures 1-3 listed below have been reported as CMP polishing liquids capable of polishing cobalt, few such liquids are known.

CITATION LIST

Patent Literature

PLT 1: JP 2011-91248 A
PLT 2: JP 2012-182158 A
PLT 3: JP 2013-42123 A

SUMMARY OF INVENTION

Technical Problem

Based on the findings of the inventors of the present invention, cobalt exhibits a higher level of corrodibility than metals such as copper-based metals that have conventionally been used as conductive substances, and therefore if a conventional metal CMP polishing liquid is used without any modification, the cobalt tends to undergo excessive etching, leading to the formation of slits in the wiring pattern. As a result, there is a possibility that the cobalt may not be able to fulfill its function as a barrier metal portion, resulting in the diffusion of metal ions into the insulating material portion. If metal ions diffuse into the insulating material portion, then there is an increased chance of shorts occurring in the semiconductor device. On the other hand, if a metal corrosion inhibitor having a powerful anticorrosive effect is added to the CMP polishing liquid, or the amount of metal corrosion inhibitor is increased, then the polishing rate of the cobalt decreases.

Further, the inventors of the present invention also made the following discovery. That is, when cobalt is used for the barrier metal portion in the damascene method, the conductive substance is exposed to the CMP polishing liquid in the step of polishing and removing the cobalt. The CMP polishing liquid used at this time sometimes contains an oxidizing agent, or the pH of the CMP polishing liquid is sometimes low. In such cases, the difference in the standard redox potentials of the cobalt and the conductive substance in the CMP polishing liquid causes the cobalt to be subjected to galvanic attack by the conductive substance. As a result of this type of galvanic attack, the cobalt undergoes galvanic corrosion (for example, interfacial corrosion or the like), causing a deterioration in the circuit performance. In order to prevent any deterioration in the circuit performance, it is desirable to suppress such galvanic corrosion as much as possible.

Accordingly, the embodiments of the present invention have objects of providing a CMP polishing liquid and a polishing method that can suppress galvanic corrosion of a cobalt-containing portion while maintaining a favorable polishing rate for the cobalt-containing portion.

Solution to Problem

Generally, when two different metals connected in series are brought into contact with an electrolyte (for example, when two different metals are immersed in an electrolyte), a galvanic cell is formed. In a galvanic cell, the first metal that constitutes the anode is corroded at a faster rate than the case where the second metal that constitutes the cathode does not exist. In contrast, the second metal that constitutes the cathode is corroded at a slower rate than the case where the first metal that constitutes the anode does not exist. The driving force behind the corrosion process is the potential difference between the two metals, and more specifically, the difference in the open circuit potential (corrosion potential) values of the two metals contacting the specific electrolyte. It is well known that when two metals contact an electrolyte and form a galvanic cell, a galvanic current develops in accordance with the potential difference between the two metals. The size of this galvanic current correlates directly with the corrosion rate of the metal that constitutes the anode.

The inventors of the present invention discovered that when polishing a polishing target surface having a cobalt-containing portion and a metal-containing portion that contains a metal other than cobalt (hereafter sometimes referred to as simply the "metal-containing portion"), if the absolute value of the difference in the corrosion potentials (the difference in the open circuit potentials) between the cobalt and the metal other than cobalt in the CMP polishing liquid is 0~300 mV, then the corrosion rate of the cobalt due to the establishment of a galvanic coupling with the metal other than cobalt is reduced, and galvanic corrosion of the cobalt-containing portion by the CMP polishing liquid is suppressed.

Further, the inventors of the present invention also discovered that when polishing a polishing target surface having a cobalt-containing portion and a metal-containing portion that contains a metal other than cobalt, if the CMP polishing liquid includes at least two compounds selected from the group consisting of pyridines, tetrazoles, triazoles, benzotriazoles and phthalic acids, then the corrosion rate of the cobalt due to the establishment of a galvanic coupling with the metal other than cobalt is reduced, and galvanic corrosion of the cobalt-containing portion by the CMP polishing liquid is suppressed.

In other words, one embodiment of the present invention relates to a CMP polishing liquid used for polishing a polishing target surface having at least a cobalt-containing portion and a metal-containing portion that contains a metal other than cobalt, wherein the CMP polishing liquid contains polishing particles, a metal corrosion inhibitor and water, and has a pH of 4.0 or less, and when the corrosion potential $E_A$ of cobalt and the corrosion potential $E_B$ of the metal are measured in the CMP polishing liquid, the absolute value of the corrosion potential difference $E_A-E_B$ between the corrosion potential $E_A$ and the corrosion potential $E_B$ is 0~300 mV.

The metal corrosion inhibitor preferably includes at least one compound selected from the group consisting of pyridines and azoles. This enables galvanic corrosion of the cobalt-containing portion to be suppressed, while maintaining a favorable polishing rate for the cobalt-containing portion.

The CMP polishing liquid may also include a phthalic acid. This enables a favorable polishing rate to be obtained for the cobalt-containing portion, and can also suppress corrosion.

Further, another embodiment of the present invention relates to a CMP polishing liquid used for polishing a polishing target surface having at least a cobalt-containing portion and a metal-containing portion that contains a metal other than cobalt, wherein the CMP polishing liquid contains polishing particles, water and at least two compounds selected from the group consisting of pyridines, tetrazoles, triazoles, benzotriazoles and phthalic acids, and has a pH of 4.0 or less.

Examples of preferred embodiments of the above CMP polishing liquid include a CMP polishing liquid containing polishing particles, water, at least one compound selected from the group consisting of pyridines and tetrazoles, and at least one compound selected from the group consisting of triazoles and benzotriazoles; a CMP polishing liquid containing polishing particles, water, and at least two compounds selected from the group consisting of triazoles and benzotriazoles; and a CMP polishing liquid containing polishing particles, water, at least one compound selected from the group consisting of pyridines, tetrazoles, triazoles and benzotriazoles, and a phthalic acid. These forms enable galvanic corrosion of the cobalt-containing portion to be suppressed, while maintaining a favorable polishing rate for the cobalt-containing portion.

One embodiment of the above CMP polishing liquid may further include a quaternary phosphonium salt. This protects the polishing target surface, and also enables suppression of polishing of the metal-containing portion and the insulating material portion. In terms of these properties, the quaternary phosphonium salt preferably includes at least one salt selected from the group consisting of triarylphosphonium salts and tetraarylphosphonium salts.

In one embodiment of the above CMP polishing liquid, the polishing particles may include at least one material selected from the group consisting of silica particles, alumina particles, ceria particles, titania particles, zirconia particles, germania particles, and modified products of these particles. This tends to improve the polishing rate of the metal-containing portion provided in the vicinity of the cobalt-containing portion.

One embodiment of the above CMP polishing liquid may further include a metal oxidizing agent. This enables further improvement in the polishing rate of the metal-containing portion.

One embodiment of the above CMP polishing liquid may further include an organic solvent. This enables an improvement in the wettability of the metal-containing portion provided in the vicinity of the cobalt-containing portion, and can further improve the polishing rate of the metal-containing portion.

Yet another embodiment of the present invention relates to a polishing method including polishing and removing at least a portion of a cobalt-containing portion from a polishing target surface having at least the cobalt-containing portion and a metal-containing portion that contains a metal other than cobalt using any of the CMP polishing liquids described above.

Yet another embodiment of the present invention relates to a polishing method, including a step of preparing a substrate including an insulating material portion having recesses and protrusions on a surface thereof, a barrier metal portion which covers the insulating material portion following the recesses and protrusions, and a conductive substance portion which fills the recesses and covers the barrier metal portion, wherein the barrier metal portion includes a cobalt-containing portion and the conductive substance portion includes a metal-containing portion that contains a metal other than cobalt; a first polishing step of polishing the conductive substance portion and exposing the barrier metal portion on the protrusions; and a second polishing step of polishing and removing the barrier metal portion exposed in the first polishing step using any of the CMP polishing liquids described above.

In one embodiment of the above polishing method, the insulating material portion is a silicon-based insulating material portion or an organic polymer-based insulating material portion.

In one embodiment of the above polishing method, the conductive substance portion includes copper as the main component.

In one embodiment of the above polishing method, the barrier metal portion includes a cobalt-containing portion, and at least one portion selected from the group consisting of a tantalum-containing portion, a titanium-containing portion, a tungsten-containing portion, and a ruthenium-containing portion.

Advantageous Effects of Invention

One embodiment of the present invention can provide a CMP polishing liquid that is capable of suppressing galvanic corrosion of a cobalt-containing portion while maintaining a favorable polishing rate for the cobalt-containing portion. Further, another embodiment of the present invention can provide a polishing method that is capable of suppressing galvanic corrosion of a cobalt-containing portion while maintaining a favorable polishing rate for the cobalt-containing portion.

The present invention is related to the subject matter disclosed in prior Japanese Application 2014-141533 filed on Jul. 9, 2014, the entire contents of which are incorporated herein by reference.

DESCRIPTION OF EMBODIMENTS

Figure 1:
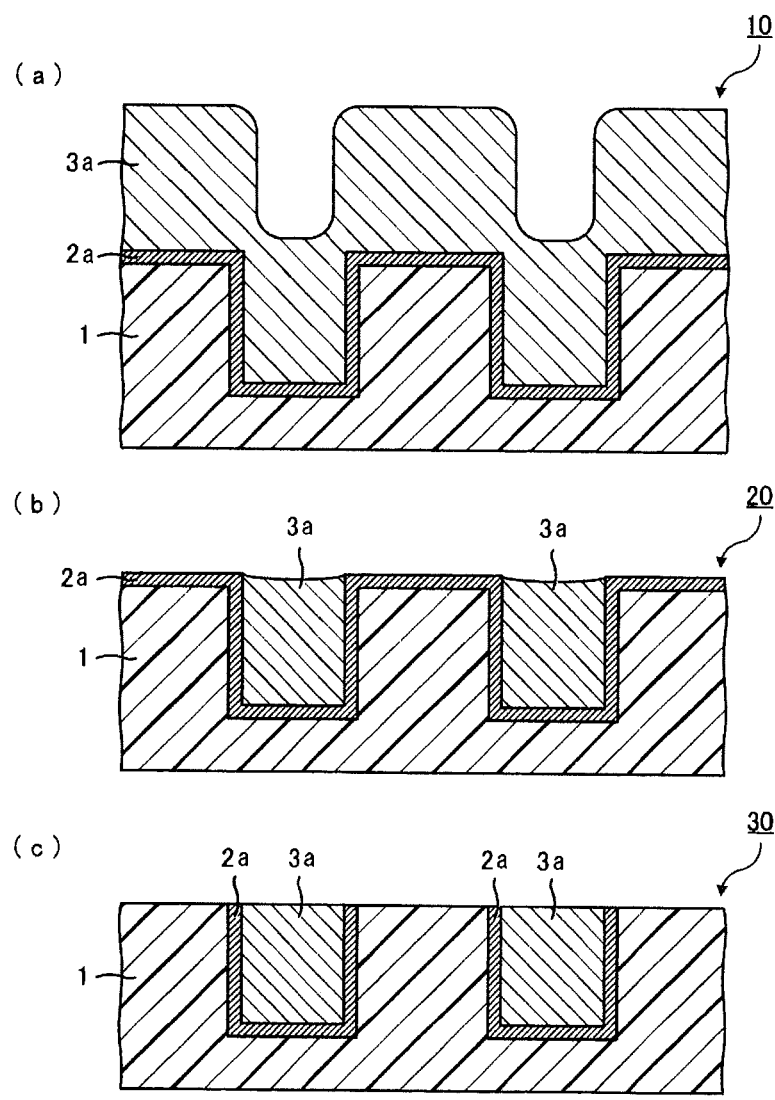
FIG. 1 is a schematic cross-sectional view illustrating one example of a polishing method according to an embodiment of the present invention.

In the embodiments of the present invention, the "polishing rate" means the rate at which a substance A undergoing CMP is removed by polishing (for example, the reduction in the thickness of the substance A per unit of time, or the removal rate).

The term "step" includes not only independent steps, but also steps which cannot be clearly distinguished from another step, provided an operation that is prescribed in the "step" is implemented.

A numerical range specified using the symbol "~" describes a range which includes the numbers recorded before and after the "~" as the minimum value and maximum value respectively.

In those cases where a plurality of substances corresponding with a particular components exist within the CMP polishing liquid, unless specifically stated otherwise, the amount of that particular component within the CMP polishing liquid means the combined total of the plurality of substances within the CMP polishing liquid.

Embodiments of the present invention are described below in further detail.

<CMP Polishing Liquid>

The CMP polishing liquid according to an embodiment of the present invention is a CMP polishing liquid used for polishing a polishing target surface having at least a cobalt-containing portion and a metal-containing portion that contains a metal other than cobalt.

In one embodiment, the CMP polishing liquid contains polishing particles (hereafter also referred to as "abrasive grains"), a metal corrosion inhibitor and water, and has a pH of 4.0 or less. In the CMP polishing liquid according to this embodiment, when the corrosion potential $E_A$ of cobalt and the corrosion potential $E_B$ of the metal other than cobalt are measured in the CMP polishing liquid, the absolute value of the corrosion potential difference $E_A$–$E_B$ between the corrosion potential $E_A$ and the corrosion potential $E_B$ is 0~300 mV.

Further, in another embodiment, the CMP polishing liquid contains polishing particles, a metal corrosion inhibitor and/or an organic acid, and water, and has a pH of 4.0 or less. Specifically, the CMP polishing liquid according to this embodiment contains two or more compounds selected from the group consisting of pyridines, tetrazoles, triazoles, benzotriazoles and phthalic acids as the metal corrosion inhibitor and/or the organic acid.

<Abrasive Grains>

The CMP polishing liquid contains abrasive grains. Including these abrasive grains tends to improve the polishing rate of the metal-containing portion provided in the vicinity of the cobalt-containing portion. A single type of abrasive grain may be used, or a mixture of two or more types may be used.

Examples of the abrasive grains include inorganic polishing particles such as silica particles, alumina particles, zirconia particles, ceria particles, titania particles, germania particles and silicon carbide particles; organic polishing particles such as polystyrene particles, polyacrylic acid particles and polyvinyl chloride particles; and modified products of these particles.

The abrasive grains preferably includes at least one material selected from the group consisting of silica particles, alumina particles, zirconia particles, ceria particles, titania particles, germania particles and modified products of these particles.

From the viewpoints of ensuring good dispersion stability within the CMP polishing liquid and minimizing the occurrence of polishing scratches (also referred to as simply "scratches") generated by CMP, silica particles and alumina particles are preferred, colloidal silica and colloidal alumina are more preferred, and colloidal silica are particularly desirable.

From the viewpoint of obtaining a favorable polishing rate, the amount of the abrasive grains within the total mass of the CMP polishing liquid is preferably at least 1.0% by mass, more preferably at least 1.2% by mass, and even more preferably 1.5% by mass or more. Further, from the viewpoints of maintaining good dispersion stability of the abrasive grains and suppressing the occurrence of polishing scratches, the amount of the abrasive grains within the total mass of the CMP polishing liquid is preferably not more than 5.0% by mass, more preferably not more than 4.5% by mass, and even more preferably 4.0% by mass or less.

From the viewpoint of obtaining a favorable polishing rate, the average particle size of the abrasive grains is preferably at least 40 nm, more preferably at least 45 nm, and even more preferably 50 nm or greater. Further, from the viewpoint of suppressing polishing scratches, the average particle size of the abrasive grains is preferably not more than 80 nm, more preferably not more than 75 nm, and even more preferably 70 nm or less.

The particle size (average secondary particle size) of the abrasive grains can be measured with a light diffraction and scattering particle size distribution analyzer (for example, a "Coulter N4SD" manufactured by Coulter Electronics Ltd.), using a water dispersion as a sample, which can be prepared by diluting the CMP polishing liquid with water as required. The measurement conditions for the light diffraction and scattering particle size distribution analyzer may include, for example, a measurement temperature of 20° C., a solvent refractive index of 1.333 (corresponding with the refractive index of water), a refractive index for the particles of "unknown" (set), a solvent viscosity of 1.005 mPa (corresponding with the viscosity of water), a run time of 200 seconds, and a laser incident angle of 90°. Further, in order to ensure that the intensity (the scattering intensity, which corresponds with the turbidity) falls within a range of $5 \times 10^4 \sim 4 \times 10^5$, the CMP polishing liquid is diluted with water to obtain a water dispersion prior to measurement in those cases where the intensity exceeds $4 \times 10^5$.

<Metal Corrosion Inhibitor>

The CMP polishing liquid contains a metal corrosion inhibitor. By including the metal corrosion inhibitor, galvanic corrosion can be effectively suppressed while maintaining a favorable polishing rate for the cobalt-containing portion. A single type of metal corrosion inhibitor may be used alone, or a mixture of two or more types may be used.

From the viewpoint of suppressing galvanic corrosion while maintaining a favorable polishing rate for the cobalt-containing portion, at least one compound selected from the group consisting of pyridines and azoles is preferably used as the metal corrosion inhibitor. The term "pyridines" describes compounds having a pyridine framework within the molecule, and includes pyridine and a pyridine compound having a substituent. The term "azoles" describes compounds having an azole framework within the molecule, and includes an azole and an azole compound having a substituent. Compounds having both a pyridine structure and an azole structure are classified as "pyridines". Further, metal corrosion inhibitors having an acid group within the molecule are classified not as the "organic acids" described below, but rather as "metal corrosion inhibitors". Examples of the above substituents include alkyl groups; a hydroxyl group, carboxyl group, amino group, cyano group, acetyl group or nitro group; and alkyl groups substituted with one of these groups. Substituents may be bonded together to form a ring. For the alkyl group, an alkyl group having a carbon number of 1~10 is preferred, an alkyl group having a carbon number of 1~8 is more preferred, and an alkyl group having a carbon number of 1~5 is particularly desirable. From the viewpoint of suppressing galvanic corrosion, the pyridines and azoles are preferably either unsubstituted, or have an alkyl group, hydroxyl group or amino group.

Specific examples of the pyridines include 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetoamidopyridine, 4-pyrrolidinopyridine, and 2-cyanopyridine.

Specific examples of the azoles include pyrazoles such as pyrazole, 1-allyl-3,5-dimethylpyrazole, 3,5-di(2-pyridyl)pyrazole, 3,5-diisopropylpyrazole, 3,5-dimethyl-1-hydroxymethylpyrazole, 3,5-dimethyl-1-phenylpyrazole, 3,5-dimethylpyrazole, 3-amino-5-hydroxypyrazole, 4-methylpyrazole, N-methylpyrazole, 3-aminopyrazole and 4-aminopyrazole; imidazoles such as 1,1'-carbonylbis-1H-imidazole, 1,1'-oxalyldiimidazole, 1,2,4,5-tetramethylimidazole, 1,2-dimethyl-5-nitroimidazole, 1,2-dimethylimidazole, 1-(3-aminopropyl)imidazole, 1-butylimidazole, 1-ethylimidazole and 1-methylimidazole; thiazoles such as 2,4-dimethylthiazole; benzothiazoles such as 2-mercaptobenzothiazole; tetrazoles such as tetrazole, 5-methyltetrazole, 5-aminotetrazole, 1,5-pentamethylenetetrazole and 1-(2-dimethylaminoethyl)-5-mercaptotetrazole; triazoles such as 1,2,3-triazole, 1,2,4-triazole and 3-amino-1,2,4-triazole; and benzotriazoles such as benzotriazole, 1-hydroxybenzotriazole, 1-dihydroxypropylbenzotriazole, 2,3-dicarboxypropylbenzotriazole, 4-hydroxybenzotriazole, 4-carboxybenzotriazole and 5-methylbenzotriazole. Tetrazoles, triazoles and benzotriazoles are preferred as the azoles.

From the viewpoint of effectively suppressing galvanic corrosion while maintaining a favorable polishing rate for the cobalt-containing portion, at least one compound (hereafter referred to as the "metal corrosion inhibitor (A)") selected from the group consisting of pyridines, pyrazoles, imidazoles, benzothiazoles, thiazoles and tetrazoles is preferably used as the metal corrosion inhibitor. The use of at least one compound selected from the group consisting of pyridines and tetrazoles is more preferred, and pyridines are particularly desirable. Among the various pyridines, pyridines having an amino group or a hydroxyl group are preferred, pyridines having an amino group are more preferred, 3-aminopyridine or 4-aminopyridine is even more preferred, and 3-aminopyridine is particularly desirable.

Among the various tetrazoles, tetrazoles having an amino group or an alkyl group are preferred, tetrazoles having an amino group are more preferred, and 5-aminotetrazole is particularly desirable.

From the viewpoint of suppressing galvanic corrosion of the cobalt-containing portion, the amount of the metal corrosion inhibitor (A) within the total mass of the CMP polishing liquid is preferably at least 0.001% by mass, more preferably at least 0.01% by mass, and even more preferably 0.02% by mass or more. Further, from the viewpoint of obtaining a favorable polishing rate for the cobalt-containing portion, the amount of the metal corrosion inhibitor (A) within the total mass of the CMP polishing liquid is preferably not more than 5% by mass, more preferably not more than 3% by mass, and even more preferably 1% by mass or less.

Furthermore, from the viewpoint of effectively suppressing galvanic corrosion of the cobalt-containing portion, at least one compound (hereafter referred to as the "metal corrosion inhibitor (B)") selected from the group consisting of triazoles and benzotriazoles is preferably used as the metal corrosion inhibitor. Benzotriazoles are more preferred, at least one compound selected from the group consisting of benzotriazoles having a hydroxyl group and benzotriazoles having an alkyl group is even more preferred, and benzotriazoles having a hydroxyl group are particularly desirable. Among benzotriazoles having a hydroxyl group, 1-hydroxybenzotriazole is preferred. Among the various triazoles, 1,2,3-triazole or 1,2,4-triazole is preferred, and 1,2,4-triazole is more preferred.

From the viewpoint of effectively suppressing galvanic corrosion of the cobalt-containing portion, the amount of the metal corrosion inhibitor (B) within the total mass of the CMP polishing liquid is preferably at least 0.001% by mass, more preferably at least 0.005% by mass, and even more preferably 0.01% by mass or more. Further, from the viewpoint of maintaining the polishing rates for the cobalt-containing portion and the metal-containing portion at practically applicable levels, the amount of the metal corrosion inhibitor (B) within the total mass of the CMP polishing liquid is preferably not more than 10% by mass, more preferably not more than 5% by mass, and even more preferably 2% by mass or less.

A single type of metal corrosion inhibitor may be used alone, or a mixture of two or more types may be used. In those cases where two or more types are mixed, at least one compound selected from the group consisting of pyridines, tetrazoles, triazoles and benzotriazoles, and at least one other compound different from the "at least one compound" and selected from the group consisting of pyridines, tetrazoles, triazoles and benzotriazoles are preferably mixed. This particular example represents a combination of two types of metal corrosion inhibitor, but other metal corrosion inhibitors (such as other azoles) may also be used in combination with this mixture. From the viewpoint of obtaining an efficient effect from a combination of the two types of metal corrosion inhibitor mentioned above, the use of only the two types of metal corrosion inhibitor is also possible.

Specifically, two or more types of either the metal corrosion inhibitor (A) or the metal corrosion inhibitor (B) may be used, or a combination of the metal corrosion inhibitor (A) and the metal corrosion inhibitor (B) may be used, and the use of either two or more types of the metal corrosion inhibitor (B) or a combination of the metal corrosion inhibitor (A) and the metal corrosion inhibitor (B) is preferred. If two types of the metal corrosion inhibitor (B) are used, then from the viewpoint of obtaining a favorable polishing rate for the cobalt-containing portion, the content ratio between the metal corrosion inhibitor (B1) and the metal corrosion inhibitor (B2) (namely, the mass ratio of (metal corrosion inhibitor (B1):metal corrosion inhibitor (B2))) is preferably 10:1~1:10, more preferably 5:1~1:5, and even more preferably 2:1~1:2. If a combination of the metal corrosion inhibitor (A) and the metal corrosion inhibitor (B) is used, then from the viewpoint of obtaining a favorable polishing rate for the cobalt-containing portion, the content ratio between the metal corrosion inhibitor (A) and the metal corrosion inhibitor (B) (namely, the mass ratio of (metal corrosion inhibitor (A):metal corrosion inhibitor (B))) is preferably 10:1~1:10, more preferably 5:1~1:5, and even more preferably 2:1~1:2. Furthermore, in those cases where two or more types of the metal corrosion inhibitor (B) are used, particularly preferred combinations include combinations of "a benzotriazole having a hydroxyl group, and a benzotriazole having an alkyl group", and combinations of "a benzotriazole having a hydroxyl group, and a triazole". In those cases where a combination of the metal corrosion inhibitor (A) and the metal corrosion inhibitor (B) is used, particularly preferred combinations include a combination of "a pyridine having an amino group or a hydroxyl group, and a benzotriazole having a hydroxyl group" and combinations of "a tetrazole having an amino group or an alkyl group, and a benzotriazole having a hydroxyl group".

From the viewpoint of effectively suppressing galvanic corrosion of the cobalt-containing portion, the total amount of the metal corrosion inhibitor within the total mass of the CMP polishing liquid is preferably at least 0.001% by mass, more preferably at least 0.005% by mass, and even more preferably 0.01% by mass or more. Further, from the viewpoint of obtaining favorable polishing rates for the cobalt-containing portion and the metal-containing portion, the total amount of the metal corrosion inhibitor within the total mass of the CMP polishing liquid is preferably not more than 10% by mass, more preferably not more than 5% by mass, and even more preferably 2% by mass or less.

<Organic Acids>

The CMP polishing liquid may also contain at least one of organic acids. The organic acids have the effect of improving the polishing rates of the cobalt-containing portion and the metal-containing portion. The term "organic acids" includes an organic acid, an organic acid salt, an organic acid anhydride, and an organic acid ester (but excludes the "water-soluble polymers" described below). Among the various organic acids, from the viewpoint of suppressing corrosion of the cobalt-containing portion, phthalic acids are preferred. By using a phthalic acid, a favorable polishing rate can be obtained for the cobalt-containing portion, and corrosion can be suppressed. The term "phthalic acids" includes phthalic acid, a phthalic acid salt, a phthalic acid anhydride and a phthalic acid ester, and these compounds may or may not have a substituent. In those cases where a phthalic acid is used as the organic acid, another organic acid may also be used in combination with the phthalic acid. From the viewpoint of obtaining the effect of using the phthalic acid with good efficiency, the phthalic acid may also be used alone. Particularly superior effects can be obtained when the phthalic acid is used together with a metal corrosion inhibitor including at least one compound selected from the group consisting of pyridines and azoles, and preferably at least one compound selected from the group consisting of pyridines, tetrazoles, triazoles and benzotriazoles.

Specific examples of the phthalic acid include phthalic acid, alkylphthalic acids such as 3-methylphthalic acid and 4-methylphthalic acid, aminophthalic acids such as 3-aminophthalic acid and 4-aminophthalic acid, nitrophthalic acids such as 3-nitrophthalic acid and 4-nitrophthalic acid, salts of these phthalic acids, anhydrides of these phthalic acids, and esters of these phthalic acids. Among these, a phthalic acid having a methyl group as a substituent (methylphthalic acid) or a phthalic acid having a nitro group as a substituent (nitrophthalic acid) is preferred. For the methylphthalic acid, 3-methylphthalic acid and 4-methylphthalic acid are preferred, and 4-methylphthalic acid is particularly desirable. For the nitrophthalic acid, 3-nitrophthalic acid and 4-nitrophthalic acid are preferred, and 4-nitrophthalic acid is particularly desirable. Examples of the salts include salts with alkali metals such as sodium and potassium, salts with alkaline earth metals such as magnesium and calcium, and ammonium salts.

In those cases where the CMP polishing liquid includes at least one of the organic acids, from the viewpoint of suppressing galvanic corrosion of the cobalt-containing portion, the amount of the organic acids within the total mass of the CMP polishing liquid is preferably at least 0.001% by mass, more preferably at least 0.01% by mass, and even more preferably 0.02% by mass or more. Further, from the viewpoint of obtaining a favorable polishing rate for the cobalt-containing portion, the amount of the organic acids within the total mass of the CMP polishing liquid is preferably not more than 5% by mass, more preferably not more than 3% by mass, and even more preferably 1% by mass or less.

<Metal Oxidizing Agent>

The CMP polishing liquid preferably contains a metal oxidizing agent. There are no particular limitations on the metal oxidizing agent, and examples include hydrogen peroxide, peroxosulfates, nitric acid, potassium periodate, hypochlorous acid and ozone. From the viewpoint of improving the polishing rate of the metal-containing portion, hydrogen peroxide is particularly preferred. A single type of metal oxidizing agent may be used alone, or a mixture of two or more types may be used.

In those cases where the CMP polishing liquid includes a metal oxidizing agent, from the viewpoint of obtaining a favorable polishing rate for the cobalt-containing portion, the amount of the metal oxidizing agent within the total mass of the CMP polishing liquid is preferably at least 0.01% by mass, more preferably at least 0.02% by mass, and even more preferably 0.05% by mass or more. From the viewpoint of preventing roughening of the polishing target surface, the amount of the metal oxidizing agent is preferably not more than 30% by mass, more preferably not more than 15% by mass, and even more preferably 10% by mass or less.

<Organic Solvent>

The CMP polishing liquid may also contain an organic solvent. By including an organic solvent, the wettability of the metal-containing portion provided in the vicinity of the cobalt-containing portion by the CMP polishing liquid can be improved. There are no particular limitations on the organic solvent, but organic solvents which can be mixed with water are preferred, and organic solvents that can be dissolved in an amount of at least 0.1 g in 100 g of water at 25° C. are particularly preferred. A single type of organic solvent may be used, or a mixture of two or more types may be used.

Examples of the organic solvent include carbonate esters such as ethylene carbonate, propylene carbonate, dimethyl carbonate, diethyl carbonate and methyl ethyl carbonate; lactones such as butyl lactone and propyl lactone; glycols such as ethylene glycol, propylene glycol, diethylene glycol, dipropylene glycol, triethylene glycol and tripropylene glycol; ethers (excluding derivatives of glycols) such as tetrahydrofuran, dioxane and polyethylene oxide; alcohols (monoalcohols) such as methanol, ethanol, propanol, n-butanol, n-pentanol, n-hexanol, isopropanol and 3-methoxy-3-methyl-1-butanol; ketones such as acetone and methyl ethyl ketone; amides such as dimethylformamide and N-methylpyrrolidone; esters (excluding carbonate esters, lactones and derivatives of glycols) such as ethyl acetate and ethyl lactate; and sulfolanes such as sulfolane.

The organic solvent may be a derivative of a glycol. Examples include glycol monoethers such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether and tripropylene glycol monobutyl ether; glycol ethers such as ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether and tripropylene glycol dibutyl ether; and glycol esters such as ethylene glycol monomethyl ether acetate, diethylene glycol monoethyl ether acetate and propylene glycol monomethyl ether acetate.

The organic solvent is preferably at least one solvent selected from among glycols, derivatives of glycols, alcohols and carbonate esters, and is more preferably an alcohol.

When the CMP polishing liquid includes an organic solvent, from the viewpoint of obtaining favorable wettability of the metal-containing portion, the amount of the organic solvent within the total mass of the CMP polishing liquid is preferably at least 0.1% by mass, more preferably at least 0.2% by mass, and even more preferably 0.5% by mass or more. Further, from the viewpoint of preventing the possibility of ignition, thus enabling the production process to be implemented safely, the amount of the organic solvent within the total mass of the CMP polishing liquid is preferably not more than 95% by mass, more preferably not more than 50% by mass, even more preferably not more than 10% by mass, even more preferably not more than 5% by mass, and most preferably 3% by mass or less.

<Water-Soluble Polymer>

The CMP polishing liquid may also contain a water-soluble polymer. Including a water-soluble polymer can suppress galvanic corrosion of the cobalt-containing portion, protect the polishing target surface, and reduce the occurrence of defects. Water-soluble polymers which can be dissolved in an amount of at least 0.1 g in 100 g of water at 25° C. are preferred. A single type of polymer may be used alone, or a mixture of two more types may be used.

Water-soluble polymers having carboxylic acid groups or carboxylate salt groups are preferred as the water-soluble polymer, and polycarboxylic acids and salts thereof (wherein the term "polycarboxylic acid salt" means a polymer in which some or all of the carboxylic acid groups of a polycarboxylic acid have each been substituted with a carboxylate salt group) are particularly preferred. Examples of the carboxylate salt groups include an ammonium carboxylate group and a sodium carboxylate group. Examples of the polycarboxylic acids and salts thereof include homopolymers of monomers having a carboxylic acid group such as acrylic acid, methacrylic acid and maleic acid; polymers in which some or all of the carboxylic acid groups in these homopolymers have each been substituted with a carboxylate salt group; copolymers of a monomer having a carboxylic acid group such as acrylic acid, methacrylic acid or maleic acid, and a carboxylic acid derivative such as an alkyl ester of a carboxylic acid; and copolymers in which some or all of the carboxylic acid groups in these copolymers have each been substituted with a carboxylate salt group. More specific examples include polyacrylic acid, and polyacrylic acid ammonium salts (meaning a polymer in which some or all of the carboxylic acid groups of a polyacrylic acid have each been substituted with an ammonium carboxylate group).

Additional examples of the water-soluble polymer include polycarboxylic acids and salts thereof besides those mentioned above, such as polyaspartic acid, polyglutamic acid, polylysine, polymalic acid, polyamic acid, polyamic acid ammonium salts, polyamic acid sodium salts and polyglyoxylic acid; polysaccharides such as alginic acid, pectic acid, carboxymethyl cellulose, agar, curdlan and pullulan; and vinyl-based polymers such as polyvinyl alcohol, polyvinylpyrrolidone and polyacrolein.

Among the various water-soluble polymers, a polycarboxylic acid or salt thereof, pectic acid, agar, polymalic acid, polyacrylamide, polyvinyl alcohol, polyvinylpyrrolidone, or ester or ammonium salt of one of these polymers is preferred, and a polyacrylic acid ammonium salt is particularly preferred.

From the viewpoint of obtaining a high polishing rate for the cobalt-containing portion, the weight-average molecular weight of the water-soluble polymer is preferably at least 500, more preferably at least 1,000, even more preferably at least 2,000, and most preferably 5,000 or greater. Further, from the viewpoint of solubility, the weight-average molecular weight of the water-soluble polymer is preferably not more than 1,000,000, more preferably not more than 500,000, even more preferably not more than 200,000, even more preferably not more than 100,000, and most preferably 20,000 or less.

In the embodiments of the present invention, a value obtained by measuring the molecular weight by gel permeation chromatography (GPC) based on the method described below and then referencing against standard polyacrylic acids can be used as the weight-average molecular weight. (Conditions)

Detector: RI monitor "L-3000" manufactured by Hitachi, Ltd.

Integrator: GPC integrator "D-2200" manufactured by Hitachi, Ltd.

Pump: "L-6000" manufactured by Hitachi, Ltd.

Degas device: "Shodex DEGAS" manufactured by Showa Denko K. K.

Columns: "GL-R440", "GL-R430" and "GL-R420" manufactured by Hitachi Chemical Co., Ltd., connected in this order Eluent: tetrahydrofuran (THF)

Measurement temperature: 23° C.

Flow rate: 1.75 mL/min

Measurement time: 45 min

Injection volume: 10 µL

Standard polyacrylic acid: "PMAA-32" manufactured by Hitachi Chemical Techno Service Co., Ltd.

In those cases where the CMP polishing liquid includes a water-soluble polymer, from the viewpoint of suppressing galvanic corrosion of the cobalt-containing portion, the amount of the water-soluble polymer within the total mass of the CMP polishing liquid is preferably at least 0.001% by mass, more preferably at least 0.005% by mass, and even more preferably 0.01% by mass or more. Further, from the viewpoint of obtaining a favorable polishing rate for the cobalt-containing portion, the amount of the water-soluble polymer within the total mass of the CMP polishing liquid is preferably not more than 10% by mass, more preferably not more than 5.0% by mass, and even more preferably 1.0% by mass or less.

<Quaternary Phosphonium Salt>

The CMP polishing liquid may also contain a quaternary phosphonium salt. Including a quaternary phosphonium salt can protect the polishing target surface and suppress polishing of the metal-containing portion and the insulating material portion (for example, a Low-k film).

Examples of the substituents bonded to the phosphorus atom in the quaternary phosphonium salt include aryl groups, alkyl groups and vinyl groups.

Specific examples of aryl groups that may be bonded to the phosphorus atom include a phenyl group, benzyl group and naphthyl group, and a phenyl group is preferred.

The alkyl groups bonded to the phosphorus atom may be either linear alkyl groups or branched alkyl groups. From the viewpoint of suppressing overpolishing of the metal-containing portion and the insulating material portion, the chain length of the alkyl group, based on the number of carbon atoms in the portion that can adopt the longest chain length, preferably satisfies the following range. That is, the number of carbon atoms of the alkyl group is preferably at least 1, and more preferably 4 or more. Further, from the viewpoint of the storage stability of the CMP polishing liquid, the number of carbon atoms in the alkyl group is preferably not more than 14, and more preferably 7 or fewer.

The substituents bonded to the phosphorus atom may also have bonded substituents such as halogen groups, a hydroxyl group, nitro group, cyano group, alkoxy group, carboxyl group, formyl group, amino group, alkylamino group, naphthyl group, or alkoxycarbonyl group. For example, the aryl group having a substituent may be a 2-hydroxybenzyl group, 2-chlorobenzyl group, 4-chlorobenzyl group, 2,4-dichlorobenzyl group, 4-nitrobenzyl group, 4-ethoxybenzyl group, or 1-naphthylmethyl group or the like. The alkyl group having a substituent may be a cyanomethyl group, methoxymethyl group, formylmethyl group, methoxycarbonylmethyl group, ethoxycarbonylmethyl group, 3-carboxypropyl group, 4-carboxybutyl group, or 2-dimethylaminoethyl group or the like.

There are no particular limitations on the counter anion for the quaternary phosphonium cation of the quaternary phosphonium salt, and examples include halogen ions (such as $F^-$, $Cl^-$, $Br^-$ and $I^-$), a hydroxide ion, nitrate ion, nitrite ion, hypochlorite ion, chlorite ion, chlorate ion, perchlorate ion, acetate ion, hydrogen carbonate ion, phosphate ion, sulfate ion, hydrogen sulfate ion, sulfite ion, thiosulfate ion and carbonate ion.

From the viewpoint of suppressing polishing of the metal-containing portion and the insulating material portion, the quaternary phosphonium salt preferably has a hydrophobic substituent. Examples of the hydrophobic substituent include aryl groups and long-chain alkyl groups (for example, having a carbon number of 4~12). From the viewpoints of suppressing polishing of the metal-containing portion and the insulating material portion, and preventing foaming of the CMP polishing liquid, a quaternary phosphonium salt having an aryl group is preferred.

Moreover, for the quaternary phosphonium salt, at least one salt selected from the group consisting of triarylphosphonium salts and tetraarylphosphonium salts is preferred, and a tetraarylphosphonium salt is more preferred. In terms of the triarylphosphonium salts, from the viewpoint of suppressing overpolishing of the metal-containing portion and the insulating material portion, an alkyltriarylphosphonium salt is preferred, and an alkyltriphenylphosphonium salt is particularly preferred. Further, from the same viewpoints, the tetraarylphosphonium salt is most preferably a tetraphenylphosphonium salt.

Specifically, the quaternary phosphonium salt is preferably a compound represented by formula (I) shown below.

[Chemical Formula 1]

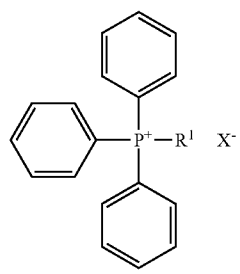

(I)

[In formula (I), each benzene ring may have a substituent, $R^1$ represents an alkyl group or aryl group which may have a substituent, and $X^-$ represents an anion.]

In formula (I), examples of the alkyl group and aryl group for $R^1$ include the alkyl groups and aryl groups described above. From the viewpoint of achieving a CMP polishing liquid with superior stability, the alkyl group for $R^1$ preferably has a carbon number of not more than 14. Examples of the aryl group for $R^1$ include a phenyl group and a methylphenyl group. Examples of possible substituents include the same substituents as those mentioned above for the substituent bonded to the phosphorus atom.

Examples of the anion $X^-$ in formula (I) include the counter anions mentioned above as the counter anion for the quaternary phosphonium cation. Although there are no particular limitations on the anion $X^-$, a halogen ion is preferred, and a bromine ion is particularly desirable.

Specific examples of the quaternary phosphonium salt include methyltriphenylphosphonium salts, ethyltriphenylphosphonium salts, triphenylpropylphosphonium salts, isopropyltriphenylphosphonium salts, butyltriphenylphosphonium salts, pentyltriphenylphosphonium salts, hexyltriphenylphosphonium salts, n-heptyltriphenylphosphonium salts, triphenyl(tetradecyl)phosphonium salts, tetraphenylphosphonium salts, benzyltriphenylphosphonium salts, (2-hydroxybenzyl)triphenylphosphonium salts, (2-chlorobenzyl)triphenylphosphonium salts, (4-chlorobenzyl)triphenylphosphonium salts, (2,4-dichlorobenzyl)triphenylphosphonium salts, (4-nitrobenzyl)triphenylphosphonium salts, 4-ethoxybenzyltriphenylphosphonium salts, (1-naphthylmethyl)triphenylphosphonium salts, (cyanomethyl)triphenylphosphonium salts, (methoxymethyl)triphenylphosphonium salts, (formylmethyl)triphenylphosphonium salts, acetonyltriphenylphosphonium salts, phenacyltriphenylphosphonium salts, methoxycarbonylmethyl(triphenyl)phosphonium salts, ethoxycarbonylmethyl(triphenyl)phosphonium salts, (3-carboxypropyl)triphenylphosphonium salts, (4-carboxybutyl)triphenylphosphonium salts, 2-dimethylaminoethyltriphenylphosphonium salts, triphenylvinylphosphonium salts, allyltriphenylphosphonium salts, and triphenylpropargylphosphonium salts. A single type of quaternary phosphonium salt may be used alone, or a combination of two or more types may be used.

Among these, from the viewpoint of obtaining good affinity with the metal-containing portion, butyltriphenylphosphonium salts, pentyltriphenylphosphonium salts, hexyltriphenylphosphonium salts, n-heptyltriphenylphosphonium salts, tetraphenylphosphonium salts and benzyltriphenylphosphonium salts are preferred. These salts are preferably bromonium salts or chloride salts.

In those cases where the CMP polishing liquid includes a quaternary phosphonium salt, from the viewpoint of suppressing polishing of the metal-containing portion and the insulating material portion, the amount of the quaternary phosphonium salt within the total mass of the CMP polishing liquid is preferably at least 0.0001% by mass, more preferably at least 0.001% by mass, and even more preferably 0.003% by mass or more. From the viewpoint of the storage stability of the CMP polishing liquid, the amount of the quaternary phosphonium salt within the total mass of the CMP polishing liquid is preferably not more than 0.1% by mass, more preferably not more than 0.05% by mass, and even more preferably 0.01% by mass or less.

<Water>

The CMP polishing liquid contains water. There are no particular limitations on the water, but a purified water can be used particularly favorably. The water is included as the remainder of the polishing liquid, and there are no particular limitations on the amount added.

<pH of CMP Polishing Liquid>

The pH of the CMP polishing liquid is 4.0 or less. Provided the pH is 4.0 or less, the polishing rates for the cobalt-containing portion and the metal-containing portion are excellent. The pH is preferably 3.8 or less, more preferably 3.6 or less, and even more preferably 3.5 or less. Further, from the viewpoint of suppressing galvanic corrosion of the cobalt-containing portion and the metal-containing portion, and from the viewpoint of eliminating any handling difficulties associated with a strongly acidic liquid, the pH of the CMP polishing liquid is preferably at least 2.0, more preferably at least 2.5, and even more preferably 2.8 or greater.

The pH can be adjusted by altering the amount added of acid components such as the organic acid or inorganic acid. Further, the pH may also be adjusted by adding an alkali component such as ammonia, sodium hydroxide or tetramethylammonium hydroxide (TMAH). From the viewpoint of adjusting the corrosion potential difference, the CMP polishing liquid preferably contains only the organic acid as an acid component, and therefore when an acid component is used for adjusting the pH, an organic acid is preferably used.

The pH of the CMP polishing liquid can be measured with a pH meter (for example, "PHL-40" manufactured by DKK Corporation, or "Model F-51" manufactured by Horiba Ltd.). Following 3-point calibration using standard buffer solutions (phthalate pH buffer solution, pH: 4.01, neutral phosphate pH buffer solution, pH: 6.86, and borate pH buffer solution, pH: 9.18), the electrode is placed in the CMP polishing liquid, and the value is read once the value has stabilized after at least 3 minutes. The liquid temperatures of the standard buffer solutions and the CMP polishing liquid are all set to 25° C.

<Absolute Value of Corrosion Potential Difference>

The CMP polishing liquid is used for polishing a polishing target surface including a cobalt-containing portion and a metal-containing portion. When the corrosion potential $E_A$ of cobalt and the corrosion potential $E_B$ of the metal other than cobalt are measured in the CMP polishing liquid, the CMP polishing liquid imparts an absolute value for the corrosion potential difference $E_A-E_B$ of 0~300 mV. By using a CMP polishing liquid for which the absolute value of the corrosion potential difference $E_A-E_B$ is 0~300 mV, galvanic corrosion of the cobalt-containing portion can be suppressed.

From the viewpoint of suppressing galvanic corrosion, the absolute value of the corrosion potential difference $E_A-E_B$ is preferably brought closer to 0 mV. In this regard, the absolute value of the corrosion potential difference $E_A-E_B$ is preferably not more than 250 mV, more preferably not more than 200 mV, and even more preferably 150 mV or less.

The corrosion potential can be determined, for example, by using the cobalt or the metal other than cobalt as the working electrode, a saturated calomel electrode as the reference electrode and a platinum electrode as the counter electrode, and following contact with the CMP polishing liquid, using an electrochemical measuring device (for example, the "Electrochemical Measurement System HZ-5000" manufactured by Hokuto Denko Corporation) to measure the corrosion potential of the reference electrode. In those cases where the metal-containing portion includes a plurality of metals, the metal having the largest content (mass) is used as the electrode material. If two or more metals have the same largest content value (mass), then the corrosion potential is measured using each of the two more metals as the electrode material, and then adopting the corrosion potential that yields the largest corrosion potential difference (absolute value) as the corrosion potential $E_B$. The absolute value of the corrosion potential difference $E_A-E_B$ can be adjusted by altering the amounts and the like of each of the components within the CMP polishing liquid. Measurements are performed at room temperature (25° C.).

The polishing target surface that is polished using the CMP polishing liquid of the embodiment includes at least a cobalt-containing portion and a metal-containing portion. The CMP polishing liquid of the embodiment is suited to polishing target surfaces in which the cobalt-containing portion exists in close proximity to the metal-containing portion, and particularly suited to polishing target surfaces in which the cobalt-containing portion exists in contact with the metal-containing portion. When the CMP polishing liquid of the embodiment is used for polishing these types of polishing target surfaces, a favorable polishing rate for the cobalt-containing portion and good suppression of galvanic corrosion can be achieved with good effect.

The CMP polishing liquid can be applied, for example, to the formation of a wiring pattern in a semiconductor device. An example of the metal-containing portion is the conductive substance portion described below. Moreover, the polishing target surface may also include an insulating material portion described below. The materials for the cobalt-containing portion and the metal-containing portion are described below.

<Polishing Method>

The polishing method according to an embodiment of the present invention is a polishing method which uses the CMP polishing liquid of the embodiment described above to polish and remove at least a portion of a cobalt-containing portion from a polishing target surface having at least the cobalt-containing portion and a metal-containing portion that contains a metal other than cobalt. The method is preferably a polishing method for polishing and removing excess portions of a cobalt-containing portion from a substrate including the cobalt-containing portion and a metal-containing portion formed on at least one surface. More specifically, the method is a polishing method for polishing and removing at least a portion of the cobalt-containing portion, while supplying the CMP polishing liquid of the embodiment described above to a location between the surface of the substrate on which the cobalt-containing portion and the metal-containing portion are formed and a polishing pad on a polishing surface plate, by moving the substrate and the polishing surface plate relative to each other with the substrate pressed against the polishing pad.

The polishing method according to the embodiment can be applied to a series of steps used in the formation of a wiring layer in a semiconductor device. In such a case, the polishing method includes, for example, a step of preparing a substrate including an insulating material portion having recesses and protrusions on a surface thereof, a barrier metal portion which covers the insulating material portion following the recesses and protrusions, and a conductive substance portion which fills the recesses and covers the barrier metal portion, wherein the barrier metal portion includes a cobalt-containing portion and the conductive substance portion includes a metal-containing portion that contains a metal other than cobalt; a first polishing step of polishing the conductive substance portion and exposing the barrier metal portion on the protrusions; and a second polishing step of polishing and removing the barrier metal portion exposed in the first polishing step using the CMP polishing liquid of the embodiment described above. One example of the polishing method is described below with reference to FIG. 1 and FIG. 2. However, potential uses of the polishing method are not limited to the steps described below.

A substrate illustrated in FIG. 1 has a cobalt-containing portion 2a as a barrier metal portion, and has a metal-containing portion 3a as a conductive substance portion. As illustrated in FIG. 1(a), prior to polishing, the substrate 10 has a silicon substrate (not shown in the drawing) on which are formed an insulating material portion 1 having a prescribed pattern of recesses, the cobalt-containing portion 2a which covers the insulating material portion 1 following the recesses and protrusions of the surface of the insulating material portion 1, and the metal-containing portion 3a formed on top of the cobalt-containing portion 2a.

Figure 2:
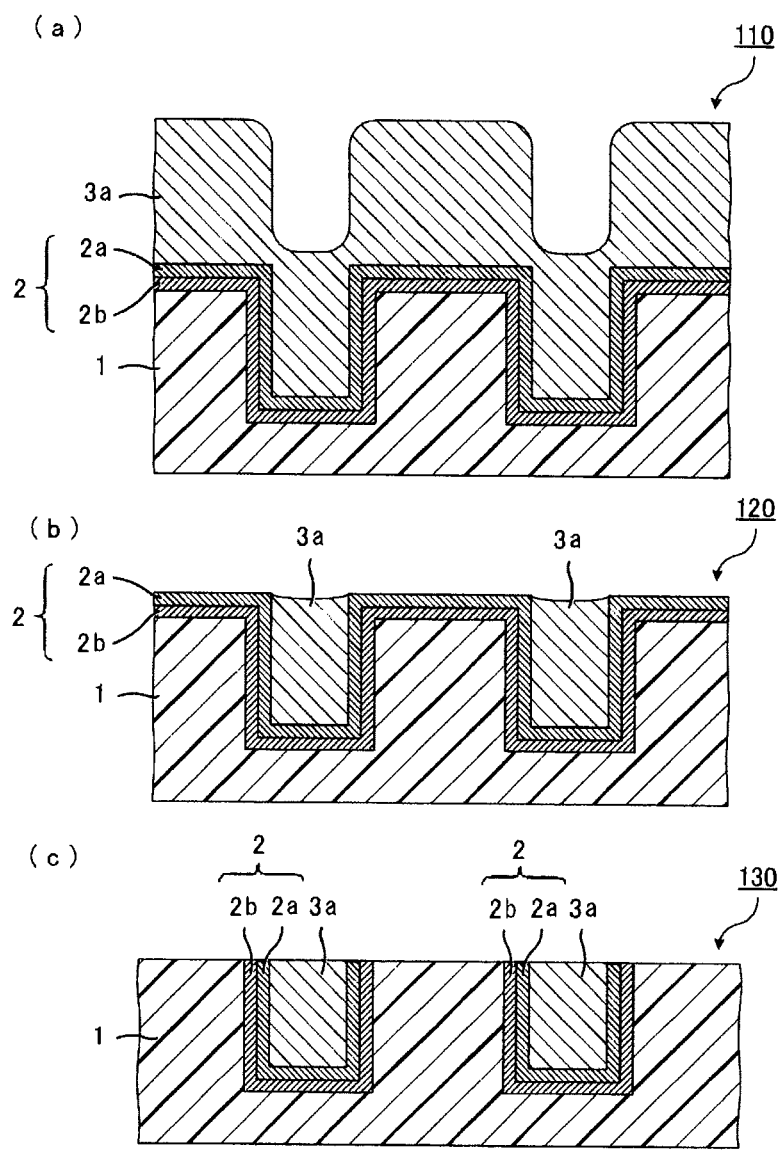
FIG. 2 is a schematic cross-sectional view illustrating one example of a polishing method according to an embodiment of the present invention.

A substrate illustrated in FIG. 2 has a cobalt-containing portion 2a and a barrier metal portion 2b as a barrier metal portion 2, and has a metal-containing portion 3a as a conductive substance portion. As illustrated in FIG. 2(a), prior to polishing, the substrate 110 has a silicon substrate (not shown in the drawing) on which are formed an insulating material portion 1 having a prescribed pattern of recesses, the barrier metal portion 2b which covers the insulating material portion 1 following the recesses and protrusions of the surface of the insulating material portion 1, the cobalt-containing portion 2a which covers the barrier metal portion 2b, and the metal-containing portion 3a formed on top of the cobalt-containing portion 2a.

Examples of the material used for forming the insulating material portion 1 include silicon-based insulators and organic polymer-based insulators. Examples of the silicon-based insulators include silica-based insulators such as silicon dioxide, fluorosilicate glass, organosilicate glass obtained using trimethylsilane or dimethoxydimethylsilane or the like as a starting raw material, silicon oxynitride and hydrogenated silsesquioxanes; as well as silicon carbide and silicon nitride. Further, examples of the organic polymer-based insulators include fully aromatic low-dielectric constant insulators. Among the above, silicon dioxide is particularly preferred.

The insulating material portion 1 is formed, for example, by a CVD (chemical vapor deposition) method, spin coating method, dip coating method, or spraying method or the like. Specific examples of the insulating material portion 1 include the interlayer insulating film or the like used in an LSI production process, and particularly in a multilayer wiring formation step.

The barrier metal portion is formed to prevent diffusion of the conductive substance into the insulating material portion 1, and to improve the adhesion between the insulating material portion 1 and the conductive substance portion. Examples of the material used in forming the cobalt-containing portion 2a include cobalt, cobalt alloys, and cobalt compounds such as cobalt oxides and oxides of cobalt alloys. Examples of the barrier metal used in forming the barrier metal portion 2b include tantalum, tantalum alloys, tantalum compounds such as tantalum nitride, titanium, titanium alloys, titanium compounds such as titanium nitride, tungsten, tungsten alloys, tungsten compounds such as tungsten nitride, ruthenium, ruthenium alloys, and ruthenium compounds such as ruthenium nitride. The barrier metal portion 2b may have a single layer structure containing one of the above materials, or a laminated structure containing two or more materials. In other words, the barrier metal portion 2b has at least one portion selected from the group consisting of a tantalum-containing portion, a titanium-containing portion, a tungsten-containing portion and a ruthenium-containing portion. The barrier metal portion is formed, for example, by vapor deposition, CVD (chemical vapor deposition) or sputtering or the like.

For the metal-containing portion 3a used as the conductive substance portion, a metal containing copper as the main component such as copper, a copper alloy, copper oxide or oxide of a copper alloy, a metal containing tungsten as the main component such as tungsten, a tungsten alloy, or a noble metal such as silver or gold may be used. Among these, a metal containing copper as the main component such as copper, a copper alloy, copper oxide or oxide of a copper alloy is preferred. The expression "metal containing copper as the main component" means a metal in which copper is the metal having the largest content (mass). The metal-containing portion 3a can be formed, for example, by a conventional sputtering method or plating method or the like.

The thickness of the insulating material portion 1 is preferably about 0.01~2.0 μm, the thickness of the cobalt-containing portion 2a is preferably about 0.01~2.5 μm, the thickness of the barrier metal portion 2b is preferably about 0.01~2.5 μm, and the thickness of the metal-containing portion 3a is preferably about 0.01~2.5 μm.

In the first polishing step, the metal-containing portion 3a, namely the conductive substance portion, is polished from the state illustrated in FIG. 1(a) until the state illustrated in FIG. 1(b), or from the state illustrated in FIG. 2(a) until the state illustrated in FIG. 2(b). In the first polishing step, the conductive substance portion on the surface of the substrate 10 or the substrate 110 is subjected to CMP using a conductive substance CMP polishing liquid having a satisfactorily large polishing rate ratio for conductive substance portion/cobalt-containing portion 2a. This removes the conductive substance portion from the tops of the protrusions, thereby exposing the cobalt-containing portion 2a at the surface, and obtaining a substrate 20 or 120 having a conductor pattern (namely a wiring pattern) containing the residual conductive substance in the recesses. One example of a CMP polishing liquid that can be used as the conductive substance CMP polishing liquid having a satisfactorily large polishing rate ratio for conductive substance portion/cobalt-containing portion 2a is the CMP polishing liquid disclosed in Japanese Patent No. 3,337,464. In the first polishing step, a portion of the cobalt-containing portion 2a on top of the protrusions may be polished together with the conductive substance portion.

In the second polishing step, the cobalt-containing portion 2a exposed in the first polishing step is polished from the state illustrated in FIG. 1(b) until the state illustrated in FIG. 1(c) using the CMP polishing liquid of the embodiment described above, thus removing the excess cobalt-containing portion.

Alternatively, as illustrated in FIG. 2, in the case where the barrier metal portion 2 has the cobalt-containing portion 2a and the barrier metal portion 2b, the cobalt-containing portion 2a and the barrier metal portion 2b are polished from the state illustrated in FIG. 2(b) until the state illustrated in FIG. 2(c), thereby removing the excess cobalt-containing portion and the excess barrier metal portion 2b. In this process, it is possible to polish the cobalt-containing portion 2a with the CMP polishing liquid of the embodiment described above, halt the polishing when the barrier metal portion 2b is exposed, and then polish the barrier metal portion 2b using a separate CMP polishing liquid designed for polishing the barrier metal portion 2b. Alternatively, the cobalt-containing portion 2a and the barrier metal portion 2b may be polished in a single series of steps using the CMP polishing liquid of the embodiment described above.

Polishing is stopped when the insulating material portion 1 beneath the barrier metal portion (either the cobalt-containing portion 2a, or the combination of the cobalt-containing portion 2a and the barrier metal portion 2b) on the protrusions is completely exposed, the conductive substance portion that forms the wiring pattern is retained in the recesses, and a substrate 30 or 130 is obtained that has a prescribed pattern in which a cross-section of the barrier metal portion is exposed at the interfaces between the protrusions and the recesses. The conductive substance portion embedded inside the recesses may also be polished together with the barrier metal portion.

In the second polishing step, the polishing target surface is polished in a state where the substrate 20 or 120 is pressed onto the polishing pad of a polishing surface plate with the polishing target surface facing the polishing pad, and the substrate 20 or 120 and the polishing surface plate are then moved relative to each other while the CMP polishing liquid is supplied to a location between the polishing pad and the substrate.

A typical polishing apparatus having a holder for holding the substrate being polished and a polishing surface plate fitted with a polishing pad and connected to a motor or the like capable of altering the rotational speed can be used as the apparatus used for the polishing. There are no particular limitations on the polishing pad, and pads formed from a typical nonwoven fabric, foamed polyurethane, or porous fluororesin or the like can be used.

There are no particular limitations on the polishing conditions, but in order to prevent the substrate flying off, the rotational speed of the polishing surface plate is preferably set to a low rotational rate of not more than 200 min$^{-1}$. The pressure with which the substrate is pressed against the polishing pad is preferably 1 kPa~100 kPa, and in order to achieve satisfactory polishing target surface in-plane uniformity and pattern smoothness at the polishing rate, the pressure is more preferably 5 kPa~50 kPa.

During polishing, the CMP polishing liquid of the embodiment described above is supplied continuously with a pump or the like to a location between the polishing pad and the polishing target surface. There are no particular limitations on the amount of liquid supplied, but the surface of the polishing pad is preferably always coated with the CMP polishing liquid. Following completion of polishing, the substrate is preferably washed thoroughly with running water, and a spin dryer or the like is used to spin off any water droplets adhered to the substrate surface before the substrate is dried.

In order to ensure that the CMP is conducted with the surface state of the polishing pad held in a uniform state, a polishing pad conditioning step is preferably included prior to the polishing. For example, conditioning of the polishing pad may be performed with a liquid containing at least water using a dresser with diamond particles. The polishing method according to the embodiment is then performed, and a substrate washing step is preferably then included.

A second layer insulating material portion, barrier metal portion and conductive substance portion may be formed on the wiring pattern formed in the manner described above, and the entire structure may then be polished to achieve a smooth surface across the entire semiconductor substrate. By repeating these steps a prescribed number of times, a semiconductor device having the desired number of wiring layers can be produced.

The CMP polishing liquid of the present invention is not limited to the polishing of semiconductor substrates as described above, and can also be used for polishing the substrates of magnetic heads or the like.

EXAMPLES

The present invention is described below in further detail using a series of examples, but the present invention is in no way limited by these examples, provided the technical scope of the invention is not exceeded. For example, the types and blend ratios of the materials in the CMP polishing liquid may differ from the types and ratios disclosed in the following examples, and the composition and structure of the polishing target may also differ from the compositions and structures disclosed in the examples.

<Method for Preparing CMP Polishing Liquid>

Using the components shown in Tables 1~3, CMP polishing liquids were prepared using the method described below.

Examples 1~7 and Comparative Examples 1~3

A metal corrosion inhibitor of the type shown in Table 1~3, 3-methoxy-3-methyl-1-butanol as an organic solvent, a polyacrylic acid ammonium salt (weight-average molecular weight: 8,000) as a water-soluble polymer, a colloidal silica (average secondary particle size: 60 nm) as abrasive grains, and tetraphenylphosphonium bromide as a quaternary phosphonium salt were placed in a container, ultra pure water was then added, and the resulting mixture was stirred and mixed to dissolve all of the components. Following the addition of hydrogen peroxide (30% by mass aqueous solution) as an oxidizing agent, ultra pure water was added to bring the total to 100 parts by mass, thus obtaining a CMP polishing liquid.

Examples 8~10 and Comparative Examples 4 and 5

A metal corrosion inhibitor of the type shown in Table 2 or 3, an organic acid of the type shown in Table 2 or 3,3-methoxy-3-methyl-1-butanol as an organic solvent, a polyacrylic acid ammonium salt (weight-average molecular weight: 8,000) as a water-soluble polymer, a colloidal silica (average particle size: 60 nm) as abrasive grains, and tetraphenylphosphonium bromide as a quaternary phosphonium salt were placed in a container, ultra pure water was then added, and the resulting mixture was stirred and mixed to dissolve all of the components. Following the addition of hydrogen peroxide (30% by mass aqueous solution) as an oxidizing agent, ultra pure water was added to bring the total to 100 parts by mass, thus obtaining a CMP polishing liquid.

The amounts of each of the components are shown in Tables 1~3. The amount of the abrasive grains is shown as a % by mass value of "silica particles", and the amount of the oxidizing agent is shown as % by mass value of "hydrogen peroxide". The average particle size (average secondary particle size) of the colloidal silica and the weight-average molecular weight of the polyacrylic acid ammonium salt were measured using the methods described above.

<Method for Measuring pH>

The pH of each CMP polishing liquid was measured in accordance with the method described below.

Measurement temperature: 25° C.

Measurement apparatus: "PHL-40" manufactured by DKK Corporation

Measurement method: Following 3-point calibration using standard buffer solutions (phthalate pH buffer solution, pH: 4.01 (25° C.), neutral phosphate pH buffer solution, pH: 6.86 (25° C.), and borate pH buffer solution, pH: 9.18 (25° C.)), the electrode was placed in the CMP polishing liquid, and the pH value was measured once the value had stabilized after at least 3 minutes. The results are shown in Tables 1~3.

<Method for Measuring Absolute Value of Corrosion Potential Difference $E_A - E_B$>

Using each CMP polishing liquid, the corrosion potential difference $E_A - E_B$ was measured in the following manner. In the present examples, because the CMP polishing liquid was used for polishing a polishing target surface having a "cobalt-containing portion" described below, and "copper" as the metal-containing portion that contains a metal other than cobalt, the corrosion potential of cobalt was measured as the corrosion potential $E_A$ and the corrosion potential of copper was measured as the corrosion potential $E_B$. The results are shown in Tables 1~3.

Following measurement of the corrosion potential $E_A$ of cobalt (cobalt substrate) and the corrosion potential $E_B$ of copper (copper substrate) using an "Electrochemical Measurement System HZ-5000" manufactured by Hokuto Denko Corporation, the absolute value of the corrosion potential difference $E_A - E_B$ was determined. The measurement conditions included a measurement temperature of 25° C., a scanning range of −1,000 mV~1,000 mV, and a scanning rate of 30 mV/sec.

Figure 3:
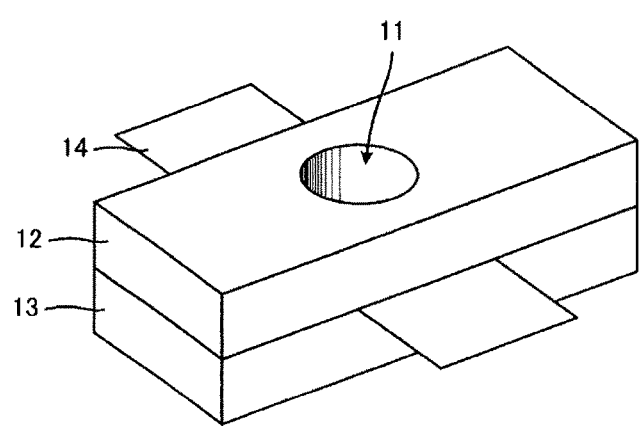
FIG. 3 is a schematic view illustrating one example of a method for measuring the corrosion potential.
Figure 3:
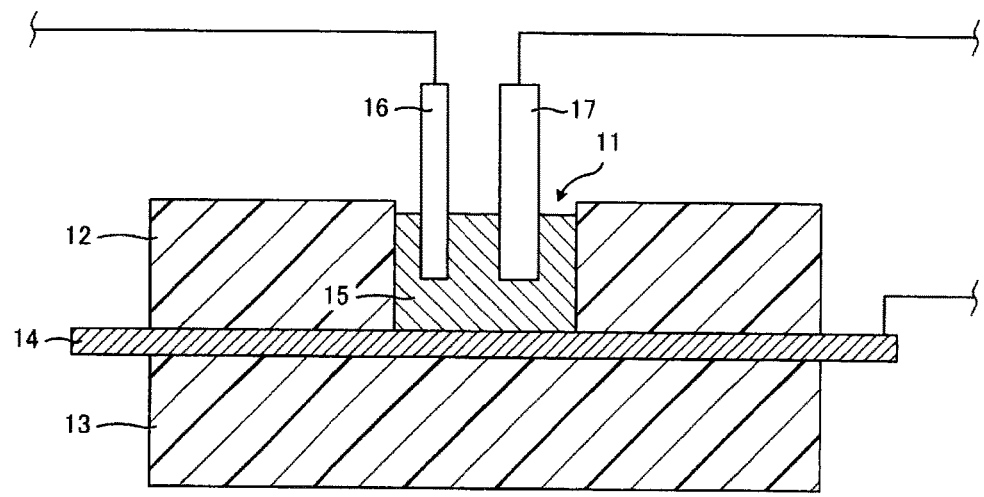
Figure 4:
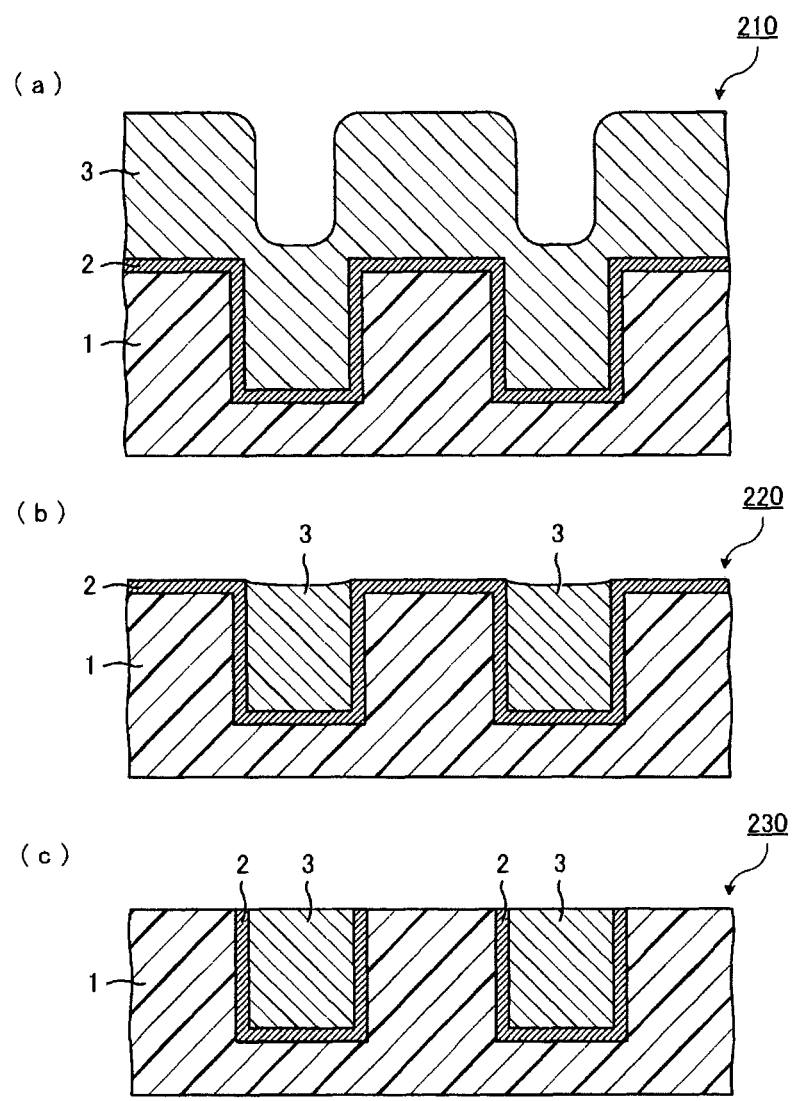
FIG. 4 is a schematic cross-sectional view illustrating the steps for forming embedded wiring according to a conventional damascene method.

The jig illustrated in FIG. 3 was used for the measurements. In other words, as illustrated in FIG. 3(a), a substrate 14 (cobalt substrate or copper substrate) formed from the metal that represents the measurement target was sandwiched between an upper jig 12 having a through-hole 11 and a lower jig 13, and the structure was thoroughly secured so that no liquid leakage occurred when a CMP polishing liquid was placed inside the through-hole portion. Next, as illustrated in FIG. 3(b), 1 mL of a CMP polishing liquid 15 was introduced into the through-hole portion, and a counter electrode (platinum) 16 and a reference electrode (saturated calomel electrode) 17 were inserted into the CMP polishing liquid 15. Further, the substrate 14 was used as the measurement electrode. The surface area of the portion of the substrate in contact with the CMP polishing liquid was 0.8 cm². The potential at the inflection point of the scan curve (potential-current density plot (polarization curve)) was read as the corrosion potential. This measurement was performed for both the cobalt substrate and the copper substrate.

<Evaluation of Polishing Characteristics>

Evaluations of the CMP polishing liquids of Examples 1~10 and Comparative Examples 1~5 were performed for each of the following categories.

(1. Cobalt Layer Polishing Rate)

[Polishing Target Substrate 1 (Blanket Substrate)]

A cobalt layer with a thickness of 200 nm was formed on a silicon substrate (a wafer of diameter 12 inches), thus forming a blanket substrate. This blanket substrate was used as a polishing target substrate 1.

[Polishing of Polishing Target Substrate 1]

Using each of the CMP polishing liquids of Examples 1~10 and Comparative Examples 1~5, polishing target substrates 1 were subjected to CMP for 1 minute under the following polishing conditions.

Polishing Apparatus: Single-Sided Metal Film Polishing Apparatus ("Reflexion LK", manufactured by Applied Materials, Inc.)

Polishing pad: Foamed polyurethane resin polishing pad

Surface plate rotational speed: 93 min⁻¹

Polishing head rotational speed: 87 min⁻¹

Polishing pressure: 10.3 kPa (1.5 psi)

CMP polishing liquid supply rate: 300 mL/min

Polishing time: 1 minute

[Washing of Polishing Target Substrate 1]

A sponge brush (made from a polyvinyl alcohol-based resin) was pressed against the polished surface of the polishing target substrate 1 that had been polished in the manner described above, and washing was performed for 1 minute by rotating the polishing target substrate 1 and the sponge brush while distilled water was supplied to the polishing target substrate 1. Subsequently, the sponge brush was removed, and distilled water was supplied to the polished surface of the polishing target substrate 1 for 1 minute. Finally, the polishing target substrate 1 was rotated at high speed to spin off the distilled water and dry the polishing target substrate 1.

[Evaluation of Polishing Rate]

The polishing rate was evaluated in the manner described below.

A calibration curve was prepared from the resistance values of blanket substrates formed with cobalt layers of various thicknesses, and formula (1) shown below was then used to determine the thickness of the cobalt layer before polishing and after polishing.

Thickness[nm] of cobalt layer before or after polishing=104.5×(resistance value [mΩ] of polishing target substrate 1/1,000)−0.893 (1)

Based on the values obtained for the thickness of the cobalt layer before polishing and the thickness of the cobalt layer after polishing, the polishing rate of the cobalt layer was determined using formula (2) shown below.

Cobalt layer polishing rate (Co—RR)[nm/min]= (thickness[nm] of cobalt layer before polishing− thickness[nm] of cobalt layer after polishing)/1 [min] (2)

Measurement of the resistance value was performed using a metal film thickness measuring device "VR-120/08S" manufactured by Hitachi Kokusai Electric Inc. The measurement results are shown in Tables 1~3 as the "cobalt polishing rate".

(2. Polishing Scratches on Cobalt Layer)

The polishing target substrate 1 that had been subjected to CMP in the manner described above was subjected to visual inspection and inspection under an optical microscope, and the presence or absence of polishing scratches was investigated. The results revealed that no significant polishing scratches occurred in any of the Examples or Comparative Examples.

(3. Galvanic Corrosion of Cobalt Layer)

[Preparation of Polishing Target Substrate 2 (Patterned Substrate)]

A patterned substrate of diameter 12 inches (30.5 cm) (φ) with a copper wiring pattern ("SEMATECH 754CMP pattern" manufactured by Advanced Material Technology) was prepared. The patterned substrate had an interlayer insulating film (thickness: 3,500 Å) composed of silicon dioxide, a barrier metal layer (thickness: 60 Å) composed of tantalum nitride, a barrier metal layer (thickness: 60 Å) composed of cobalt, and a conductive substance layer composed of copper. The conductive substance layer had a pattern with a wiring width of 180 nm and a wiring density of 50% (a pattern in which an interlayer insulating film of width 180 nm and copper wiring of width 180 nm (including the barrier metal layer) were arranged in an alternating manner). The copper outside of the recesses (grooves) was polished by a conventional CMP method using a copper polishing liquid, thereby exposing the barrier metal layer on top of the protrusions at the polishing surface, and forming a polishing target substrate 2. The polishing target substrate 2 was cut into small pieces of 2 cm×2 cm, and the CMP described below was performed.

[Polishing of Polishing Target Substrate 2]

Using each of the CMP polishing liquids of Examples 1-10 and Comparative Examples 1~5, the polishing target substrate 2 was subjected to CMP for 30 seconds under the following polishing conditions.

Polishing Apparatus: "Lapping Machine IMPTEC 10DVT" manufactured by Engis Japan Corporation Polishing pad: Foamed polyurethane resin polishing pad Polishing pressure: 30 kPa (4.4 psi)

Surface plate rotational speed: 90 min⁻¹

CMP polishing liquid supply rate: 15 mL/min

Polishing time: 30 seconds

[Evaluation of Galvanic Corrosion]

The galvanic corrosion of the polishing target substrate 2 after polishing was evaluated under the following conditions. That is, a portion of the polishing target substrate 2 after polishing having a wiring width of 180 nm and a wiring density of 50% was inspected using a "Field Emission Electron Microscope S-4800" manufactured by Hitachi High-Technologies Corporation. Those cases where absolutely no galvanic corrosion could be confirmed (absolutely no etching of the cobalt was noticeable in the vicinity of the interfaces between cobalt and copper) were evaluated as good results, and recorded in Tables 1~3 as "A". Those cases where galvanic corrosion was confirmed were recorded in Tables 1~3 as "B".

TABLE 1

|  | Example 1 | Example 2 | Example 3 | Example 4 | Example 5 |
|---|---|---|---|---|---|
| Polishing particles (% by mass) | colloidal silica 3.0 | colloidal silica 3.0 | colloidal silica 3.0 | colloidal silica 3.0 | colloidal silica 3.0 |
| Oxidizing agent (% by mass) | hydrogen peroxide 0.07 | hydrogen peroxide 0.07 | hydrogen peroxide 0.07 | hydrogen peroxide 0.07 | hydrogen peroxide 0.07 |
| Metal corrosion inhibitor (A) (% by mass) | 3-hydroxypyridine 0.1 | 4-hydroxypyridine 0.1 | 3-aminopyridine 0.1 | 5-aminotetrazole 0.1 | 1,5-pentamethylene-tetrazole 0.1 |
| Metal corrosion inhibitor (B) (% by mass) | 1-hydroxybenzo-triazole 0.1 | 1-hydroxybenzo-triazole 0.1 | 1-hydroxybenzo-triazole 0.1 | 1-hydroxybenzo-triazole 0.1 | 1-hydroxybenzo-triazole 0.1 |
| Quaternary phosphonium salt (% by mass) | tetraphenyl-phosphonium bromide 0.005 | tetraphenyl-phosphonium bromide 0.005 | tetraphenyl-phosphonium bromide 0.005 | tetraphenyl-phosphonium bromide 0.005 | tetraphenyl-phosphonium bromide 0.005 |
| Water-soluble polymer (% by mass) | polyacrylic acid ammonium salt 0.02 | polyacrylic acid ammonium salt 0.02 | polyacrylic acid ammonium salt 0.02 | polyacrylic acid ammonium salt 0.02 | polyacrylic acid ammonium salt 0.02 |
| Organic solvent (% by mass) | 3-methoxy-3-methyl-1-butanol 1.4 | 3-methoxy-3-methyl-1-butanol 1.4 | 3-methoxy-3-methyl-1-butanol 1.4 | 3-methoxy-3-methyl-1-butanol 1.4 | 3-methoxy-3-methyl-1-butanol 1.4 |
| pH | 3.3 | 3.2 | 3.1 | 2.8 | 2.9 |
| Absolute value of corrosion potential difference $E_A - E_B$ (mV) | 170 | 180 | 200 | 120 | 160 |
| Cobalt polishing rate (nm/min) | 57 | 55 | 60 | 55 | 52 |
| Galvanic corrosion | A | A | A | A | A |

TABLE 2

|  | Example 6 | Example 7 | Example 8 | Example 9 | Example 10 |
|---|---|---|---|---|---|
| Polishing particles (% by mass) | colloidal silica 3.0 | colloidal silica 3.0 | colloidal silica 3.0 | colloidal silica 3.0 | colloidal silica 3.0 |
| Oxidizing agent (% by mass) | hydrogen peroxide 0.07 | hydrogen peroxide 0.07 | hydrogen peroxide 0.07 | hydrogen peroxide 0.07 | hydrogen peroxide 0.07 |
| Metal corrosion inhibitor (B) (% by mass) | 1-hydroxybenzo-triazole 0.1 | 1-hydroxybenzo-triazole 0.1 | 1-hydroxybenzo-triazole 0.1 | 1-hydroxybenzo-triazole 0.1 | 1-hydroxybenzo-triazole 0.1 |
| Metal corrosion inhibitor (B) (% by mass) | 1,2,4-triazole 0.1 | 5-methylbenzotriazole 0.1 | — | — | — |
| Organic acid (% by mass) | — | — | 3-nitrophthalic acid 0.1 | 4-nitrophthalic acid 0.1 | 4-methylphthalic acid 0.1 |
| Quaternary phosphonium salt (% by mass) | tetraphenyl-phosphonium bromide 0.005 | tetraphenyl-phosphonium bromide 0.005 | tetraphenyl-phosphonium bromide 0.005 | tetraphenyl-phosphonium bromide 0.005 | tetraphenyl-phosphonium bromide 0.005 |
| Water-soluble polymer (% by mass) | polyacrylic acid ammonium salt 0.02 | polyacrylic acid ammonium salt 0.02 | polyacrylic acid ammonium salt 0.02 | polyacrylic acid ammonium salt 0.02 | polyacrylic acid ammonium salt 0.02 |
| Organic solvent (% by mass) | 3-methoxy-3-methyl-1-butanol 1.4 | 3-methoxy-3-methyl-1-butanol 1.4 | 3-methoxy-3-methyl-1-butanol 1.4 | 3-methoxy-3-methyl-1-butanol 1.4 | 3-methoxy-3-methyl-1-butanol 1.4 |
| pH | 3.0 | 2.9 | 2.8 | 2.9 | 3.2 |
| Absolute value of corrosion potential difference $E_A - E_B$ (mV) | 150 | 100 | 220 | 200 | 100 |
| Cobalt polishing rate (nm/min) | 61 | 54 | 62 | 65 | 60 |
| Galvanic corrosion | A | A | A | A | A |

TABLE 3

|  | Comparative Example 1 | Comparative Example 2 | Comparative Example 3 | Comparative Example 4 | Comparative Example 5 |
| --- | --- | --- | --- | --- | --- |
| Polishing particles (% by mass) | colloidal silica 3.0 | colloidal silica 3.0 | colloidal silica 3.0 | colloidal silica 3.0 | colloidal silica 3.0 |
| Oxidizing agent (% by mass) | hydrogen peroxide 0.07 | hydrogen peroxide 0.07 | hydrogen peroxide 0.07 | hydrogen peroxide 0.07 | hydrogen peroxide 0.07 |
| Metal corrosion inhibitor (A) (% by mass) | — | adenine hydrochloride 0.1 | 3,5-pyrazole dicarboxylic acid 0.1 | — | — |
| Metal corrosion inhibitor (B) (% by mass) | — | 1-hydroxybenzotriazole 0.1 | 1-hydroxybenzotriazole 0.1 | 1-hydroxybenzotriazole 0.1 | 1-hydroxybenzotriazole 0.1 |
| Organic acid (% by mass) | — | — | — | malic acid 0.1 | mellitic acid 0.1 |
| Quaternary phosphonium salt (% by mass) | tetraphenylphosphonium bromide 0.005 | tetraphenylphosphonium bromide 0.005 | tetraphenylphosphonium bromide 0.005 | tetraphenylphosphonium bromide 0.005 | tetraphenylphosphonium bromide 0.005 |
| Water-soluble polymer (% by mass) | polyacrylic acid ammonium salt 0.02 | polyacrylic acid ammonium salt 0.02 | polyacrylic acid ammonium salt 0.02 | polyacrylic acid ammonium salt 0.02 | polyacrylic acid ammonium salt 0.02 |
| Organic solvent (% by mass) | 3-methoxy-3-methyl-1-butanol 1.4 | 3-methoxy-3-methyl-1-butanol 1.4 | 3-methoxy-3-methyl-1-butanol 1.4 | 3-methoxy-3-methyl-1-butanol 1.4 | 3-methoxy-3-methyl-1-butanol 1.4 |
| pH | 3.0 | 2.7 | 3.0 | 2.5 | 3.0 |
| Absolute value of corrosion potential difference $E_A - E_B$ (mV) | 700 | 550 | 400 | 500 | 500 |
| Cobalt polishing rate (nm/min) | 120 | 90 | 80 | 130 | 100 |
| Galvanic corrosion | B | B | B | B | B |

As is evident from Tables 1~3, in Examples 1~10, by ensuring that the absolute value of the corrosion potential difference $E_A - E_B$ was small, or by ensuring that the CMP polishing liquid included specific metal corrosion inhibitor(s) and/or organic acid(s), galvanic corrosion was able to be suppressed while maintaining a favorable polishing rate for the cobalt-containing portion.

Further, in Comparative Examples 1~5, because the absolute value of the corrosion potential difference $E_A - E_B$ was large, or because the CMP polishing liquid did not include the specific metal corrosion inhibitor(s) and/or organic acid(s), galvanic corrosion occurred in the cobalt-containing portion.

Compared with conventional CMP polishing liquids, the CMP polishing liquid and the polishing method that represent embodiments of the present invention can suppress galvanic corrosion of a cobalt-containing portion while maintaining a favorable polishing rate for the cobalt-containing portion.

REFERENCE SIGNS LIST

1: Insulating material portion
2: Barrier metal portion
2a: Cobalt-containing portion
2b: Barrier metal portion
3: Conductive substance portion
3a: Metal-containing portion that contains a metal other than cobalt
10, 110, 210: Substrate before polishing
20, 120, 220: Substrate after first polishing step
30, 130, 230: Substrate after second polishing step
11: Through-hole
12: Upper jig
13: Lower jig
14: Substrate
15: CMP polishing liquid
16: Counter electrode
17: Reference electrode

The invention claimed is:

1. A CMP polishing liquid used for polishing a polishing target surface having at least a cobalt-containing portion and a metal-containing portion that contains a metal other than cobalt, wherein the CMP polishing liquid comprises polishing particles, water, a quaternary phosphonium salt comprising at least one salt selected from the group consisting of triarylphosphonium salts and tetraarylphosphonium salt, an ammonium salt comprising a water-soluble polymer having an ammonium carboxylate group, and at least two different compounds selected from the group consisting of pyridines, tetrazoles, triazoles, benzotriazoles and phthalic acids, has a pH of 3.8 or less, the at least two different compounds comprise a combination selected from (1) to (5) below:

(1) at least one compound selected from pyridines, and at least one compound selected from the group consisting of pyridines, tetrazoles, triazoles, benzotriazoles and phthalic acids;

(2) at least one compound selected from tetrazoles, and at least one compound selected from the group consisting of pyridines, tetrazoles, triazoles, benzotriazoles and phthalic acids;

(3) a benzotriazole having a hydroxyl group, and at least one compound selected from the group consisting of 1,2,3-triazole or 1,2,4-triazole, (4) a benzotriazole having a hydroxyl group, and a benzotriazole having an alkyl group; and (5) at least one compound selected from the group consisting of pyridines, tetrazoles, triazoles and benzotriazoles, and at least one compound selected from the group consisting of alkylphthalic acids, aminophthalic acids, nitrophthalic acids, salts of these phthalic acids, anhydrides of these phthalic acids, and esters of these phthalic acids, and the triarylphosphonium salts and tetraarylphosphonium salts are bromonium salts or chloride salts.

2. The CMP polishing liquid according to claim 1, wherein the polishing particles comprise at least one material selected from the group consisting of silica particles, alumina particles, ceria particles, titania particles, zirconia particles, germania particles, and modified products of these particles.

3. The CMP polishing liquid according to claim 1, further comprising a metal oxidizing agent.

4. The CMP polishing liquid according to claim 1, further comprising an organic solvent.

5. A polishing method comprising polishing and removing at least a portion of a cobalt-containing portion from a polishing target surface having at least the cobalt-containing portion and a metal-containing portion that contains a metal other than cobalt using the CMP polishing liquid according to claim 1.

6. The CMP polishing liquid according to claim 1, comprising polishing particles, water, a quaternary phosphonium salt comprising at least one salt selected from the group consisting of triarylphosphonium salts and tetraarylphosphonium salts at least one compound selected from the group consisting of pyridines and tetrazoles, and at least one compound selected from the group consisting of triazoles and benzotriazoles.

7. The CMP polishing liquid according to claim 1, comprising polishing particles, water, a quaternary phosphonium salt comprising at least one salt selected from the group consisting of triarylphosphonium salts and tetraarylphosphonium salts and at least two compounds selected from the group consisting of triazoles and benzotriazoles.

8. The CMP polishing liquid according to claim 1, wherein the at least two compounds include at least one compound selected from pyridines, and at least one compound selected from benzotriazoles.

9. The CMP polishing liquid according to claim 1, wherein the at least two compounds include a pyridine having an amino group or a hydroxyl group, and a benzotriazole having a hydroxyl group.

10. The CMP polishing liquid according to claim 1, wherein the at least two compounds include at least one compound selected from tetrazoles, and at least one compound selected from benzotriazoles.

11. The CMP polishing liquid according to claim 1, wherein the at least two compounds include a tetrazole having an amino group or an alkyl group, and a benzotriazole having a hydroxyl group.

12. The CMP polishing liquid according to claim 1, wherein the at least two compounds include at least one compound selected from benzotriazoles, and at least one compound selected from the group consisting of alkylphthalic acids, aminophthalic acids, nitrophthalic acids, salts of these phthalic acids, anhydrides of these phthalic acids, and esters of these phthalic acids.

13. The CMP polishing liquid according to claim 1, wherein the at least two compounds include a benzotriazole having a hydroxyl group, and at least one compound selected from the group consisting of alkylphthalic acids, aminophthalic acids, nitrophthalic acids, salts of these phthalic acids, anhydrides of these phthalic acids, and esters of these phthalic acids.

14. The CMP polishing liquid according to claim 1, wherein the CMP polishing liquid has a property of imparting an absolute value of a corrosion potential difference $E_A - E_B$ ranging from 0 to 300 mV, when a saturated calomel reference electrode, a platinum counter electrode, and a cobalt working electrode are used to measure a corrosion potential $E_A$ of cobalt and a corrosion potential $E_B$ of the metal other than cobalt in the CMP polishing liquid.

15. The CMP polishing liquid according to claim 1, wherein the at least two different compounds comprise a combination selected from (2) and (5) below:

(2) at least one compound selected from tetrazoles, and at least one compound selected from the group consisting of pyridines, tetrazoles, triazoles, benzotriazoles and phthalic acids; and (5) at least one compound selected from the group consisting of pyridines, tetrazoles, triazoles and benzotriazoles, and at least one compound selected from the group consisting of alkylphthalic acids, aminophthalic acids, nitrophthalic acids, salts of these phthalic acids, anhydrides of these phthalic acids, and esters of these phthalic acids.

16. The CMP polishing liquid according to claim 1, wherein the at least two different compounds comprise a combination selected from (1-1) to (5) below:

(1-1) a pyridine compound having at least one substituent in which the at least one substituent includes at least one selected from the group consisting of a hydroxyl group, a carboxyl group, an amino group, a cyano group, an acetyl group, a nitro group, and alkyl groups substituted with at least one of these groups, and at least one compound selected from the group consisting of pyridines, tetrazoles, triazoles, benzotriazoles and phthalic acids;

(1-2) at least one compound selected from the group consisting of 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetoamidopyridine, 4-pyrrolidinopyridine, and 2-cyanopyridine, and at least one compound selected from the group consisting of pyridines, tetrazoles, triazoles, benzotriazoles and phthalic acids;

(1-3) at least one compound selected from pyridines, and at least one compound selected from the group consisting of 1,2,3-triazole and 3-amino-1,2,4-triazole, (1-4) at least one compound selected from pyridines, and at least one compound selected from the group consisting of 1-hydroxybenzotriazole, 2,3-dicarboxypropylbenzotriazole, 4-hydroxybenzotriazole, and 4-carboxybenzotriazole;

(2) at least one compound selected from tetrazoles, and at least one compound selected from the group consisting of pyridines, tetrazoles, triazoles, benzotriazoles and phthalic acids;

(3-1) at least one compound selected from the group consisting of 1-hydroxybenzotriazole and 4-hydroxybenzotriazole, and at least one compound selected from the group consisting of 1,2,3-triazole or 1,2,4-triazole, (3-2) a benzotriazole having a hydroxyl group, and 1,2,3-triazole, (4-1) at least one compound selected from the group consisting of 1-hydroxybenzotriazole and 4-hydroxybenzotriazole, and a benzotriazole having an alkyl group;

(4-2) a benzotriazole having a hydroxyl group, and 5-methylbenzotriazole; and (5) at least one compound selected from the group consisting of pyridines, tetrazoles, triazoles and benzotriazoles, and at least one compound selected from the group consisting of alkylphthalic acids, aminophthalic acids, nitrophthalic acids, salts of these phthalic acids, anhydrides of these phthalic acids, and esters of these phthalic acids.

17. The CMP polishing liquid according to claim 1, wherein the quaternary phosphonium salt comprises a quaternary phosphonium salt represented by formula (I) shown below:

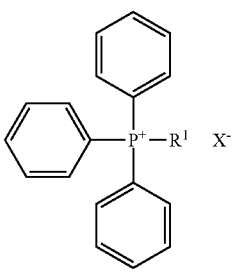

(I)

wherein each benzene ring may have a substituent, $R^1$ represents an alkyl group which may have a substituent, a phenyl group which may have a substituent, or a methylphenyl group which may have a substituent, and $X^-$ represents a bromine ion or a chlorine ion.

18. A polishing method, comprising:
a step of preparing a substrate including an insulating material portion having recesses and protrusions on a surface thereof, a barrier metal layer which covers the insulating material portion following the recesses and protrusions, and a conductive substance portion which fills the recesses and covers the barrier metal layer, wherein the barrier metal layer includes a cobalt-containing layer and the conductive substance portion includes a metal-containing portion that contains a metal other than cobalt,
a first polishing step of polishing the conductive substance portion and exposing the barrier metal layer on the protrusions, and
a second polishing step of polishing and removing the barrier metal layer exposed in the first polishing step using the CMP polishing liquid according to claim 1.

19. The polishing method according to claim 18, wherein the insulating material portion comprises a silicon-based insulator or an organic polymer-based insulator.

20. The polishing method according to claim 18, wherein the conductive substance portion comprises copper as a main component.

21. The polishing method according to claim 18, wherein the barrier metal layer includes a cobalt-containing layer, and at least one portion selected from the group consisting of a tantalum-containing portion, a titanium-containing portion, a tungsten-containing portion, and a ruthenium-containing portion.

* * * * *